US008227778B2

(12) United States Patent
Moriya et al.

(10) Patent No.: US 8,227,778 B2
(45) Date of Patent: *Jul. 24, 2012

(54) SEMICONDUCTOR EXPOSURE DEVICE USING EXTREME ULTRA VIOLET RADIATION

(75) Inventors: Masato Moriya, Hiratsuka (JP); Osamu Wakabayashi, Hiratsuka (JP); Georg Soumagne, Hiratsuka (JP)

(73) Assignees: Komatsu Ltd., Tokyo (JP); Gigaphoton, Inc., Tokyo (JP)

( * ) Notice: Subject to any disclaimer, the term of this patent is extended or adjusted under 35 U.S.C. 154(b) by 212 days.

This patent is subject to a terminal disclaimer.

(21) Appl. No.: 12/469,176

(22) Filed: May 20, 2009

(65) Prior Publication Data
US 2009/0267003 A1    Oct. 29, 2009

(30) Foreign Application Priority Data

May 20, 2008 (JP) ................................. 2008-132479
Sep. 4, 2008  (JP) ................................. 2008-226548

(51) Int. Cl.
*G21K 5/04* (2006.01)
(52) U.S. Cl. ............... 250/504 R; 250/493.1; 359/350; 359/355; 359/359; 359/361
(58) Field of Classification Search ............... 250/493.1, 250/494.1, 504 R; 359/350, 355, 359, 361
See application file for complete search history.

(56) References Cited

U.S. PATENT DOCUMENTS

| | | | |
|---|---|---|---|
| 6,469,827 B1 | 10/2002 | Sweatt et al. | |
| 6,809,327 B2 | 10/2004 | Bristol | |
| 7,050,237 B2 | 5/2006 | Chapman | |
| 2003/0072412 A1* | 4/2003 | Martynov et al. | 378/84 |
| 2003/0206340 A1* | 11/2003 | Goldstein | 359/361 |
| 2004/0109149 A1* | 6/2004 | Elp et al. | 355/67 |
| 2005/0024614 A1* | 2/2005 | Bakker | 355/67 |
| 2005/0057738 A1* | 3/2005 | Tsuji | 355/67 |
| 2005/0122589 A1* | 6/2005 | Bakker | 359/591 |

(Continued)

FOREIGN PATENT DOCUMENTS

JP    2005-064135 A    3/2005
(Continued)

OTHER PUBLICATIONS

H. Kierey, et al., "EUV spectral purity filter: optical and mechanical design, grating fabrication, and testing," "Advances in Mirror Technology for X-Ray, EUV Lithography, Laser and Other Applications,"edited by Ali M. Khounsary, et al., Proceedings of SPIE, vol. 5193. (Discussed on p. 4 of the Specification).

(Continued)

*Primary Examiner* — David A Vanore
*Assistant Examiner* — Nicole Ippolito
(74) *Attorney, Agent, or Firm* — McDermott Will & Emery LLP

(57) ABSTRACT

The exposure device is able to supply only EUV radiation to a mask, while eliminating radiation other than the EUV radiation. A multi layer made from a plurality of Mo/Si pair layers is provided upon the front surface of a mirror, and blazed grooves are formed in this multi layer. Radiation which is incident from a light source device is incident upon this mirror, and is reflected or diffracted. Since the reflected EUV radiation (including diffracted EUV radiation) and the radiation of other wavelengths are reflected or diffracted at different angles, accordingly their directions of progression are different. By eliminating the radiation of other wavelengths with an aperture and/or a dumper, it is possible to irradiate a mask only with EUV radiation of high purity.

18 Claims, 22 Drawing Sheets

U.S. PATENT DOCUMENTS

| | | | |
|---|---|---|---|
| 2005/0230645 A1 | 10/2005 | Melnychuk et al. | |
| 2006/0215137 A1 | 9/2006 | Hasegawa et al. | |
| 2006/0227826 A1 | 10/2006 | Balogh et al. | |
| 2007/0290279 A1 | 12/2007 | Imamizu | |
| 2009/0095925 A1 | 4/2009 | Ershov et al. | |
| 2009/0224182 A1* | 9/2009 | McGeoch | 250/504 R |
| 2009/0289205 A1* | 11/2009 | Moriya et al. | 250/504 R |
| 2010/0196827 A1* | 8/2010 | Leenders et al. | 430/306 |

FOREIGN PATENT DOCUMENTS

| | | |
|---|---|---|
| JP | 2006-80255 A | 3/2006 |

OTHER PUBLICATIONS

H. Kierey, et al., "EUV spectral purity filter: optical and mechanical design, grating fabrication, and testing," *Advances in Mirror Technology for X-Ray, EUV Lithography, Laser and Other Applications*, (Jan. 13, 2004) edited by Ali M. Khounsary, et al., Proceedings of SPIE, vol. 5193, pp. 70-78, (discussed on p. 4 of specification).

U.S. Appl. No. 12/469,140, filed May 20, 2009, Moriya et al.

Office Action issued with regard to U.S. Appl. No. 12/469,140, dated Oct. 12, 2011.

* cited by examiner

FIG. 18
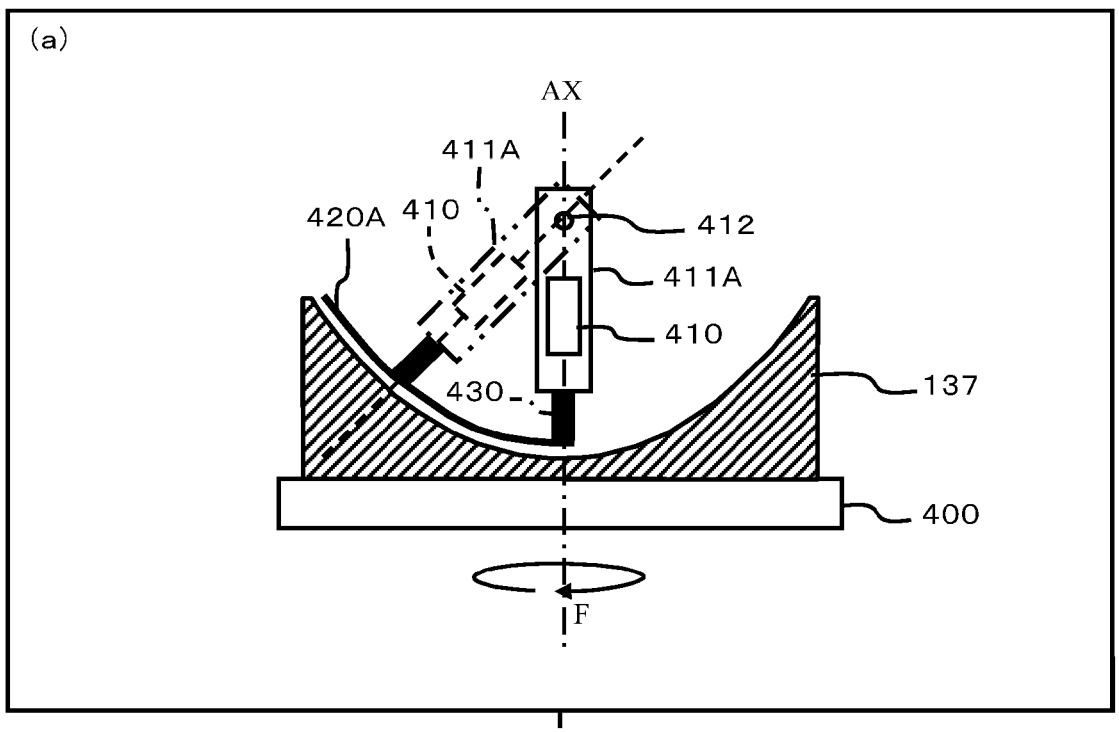
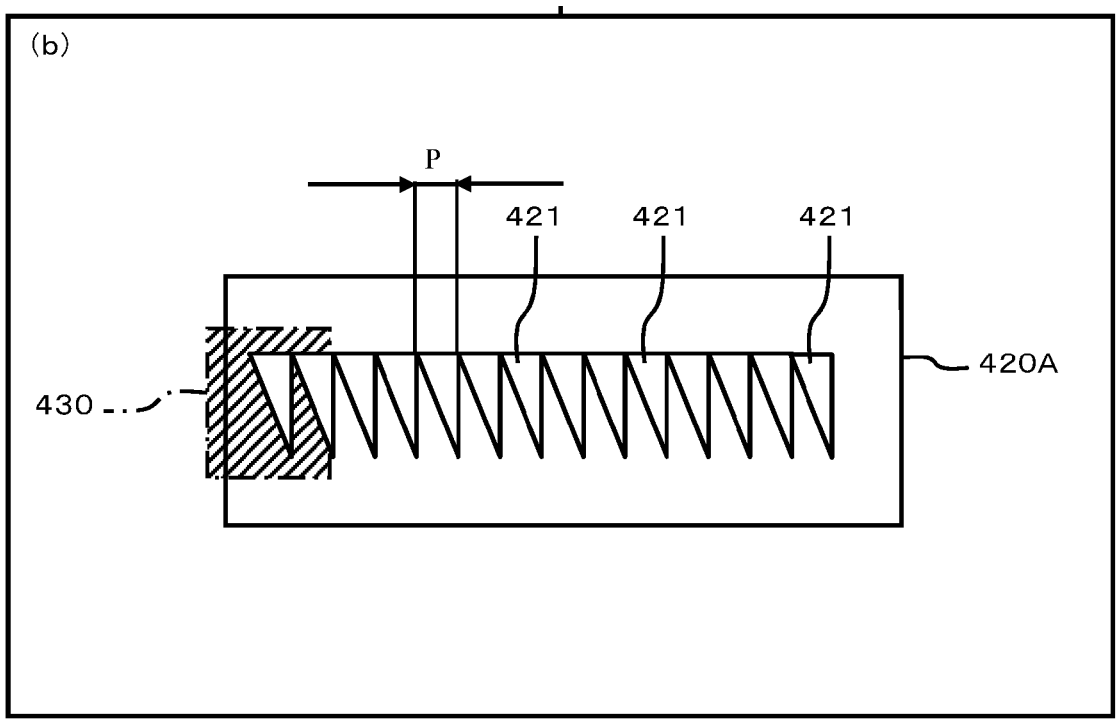

SEMICONDUCTOR EXPOSURE DEVICE USING EXTREME ULTRA VIOLET RADIATION

CROSS REFERENCE TO RELATED APPLICATIONS

The present application is based on and claims priority to Japanese Patent Application No 2008-132479 and 2008-226548 filed on May 20, 2008, and Sep. 4, 2008, the contents of which are incorporated in their entirety heroin by reference. This application is also related to U.S. application Ser. No. 12/469,140, entitled "MIRROR FOR EXTREME ULTRA VIOLET, MANUFACTURING METHOD FOR MIRROR FOR EXTREME ULTRA VIOLET, AND FAR ULTRAVIOLET LIGHT SOURCE DEVICE," filed simultaneously on May 20, 2009 with the present application.

BACKGROUND OF THE INVENTION

Technical Field

The present invention relates to a semiconductor exposure device which uses extreme ultra violet radiation.

For example, a semiconductor chip may be created by projecting a mask upon which a circuit pattern is drawn, in reduced form, upon a wafer to which a resist has been applied, and by repeatedly performing processing such as etching and thin layer formation and so on. Along with the progressive reduction of the scale of semiconductor processing, the use of radiation of progressively shorter and shorter wavelengths is required.

Thus, research is being performed into a semiconductor exposure technique which uses radiation of extremely short wavelength, such as 13.5 nm, and a reducing optical system. This type of technique is termed EUV-L (Extreme Ultra Violet Lithography: exposure using extreme ultra violet radiation). Hereinafter, extreme ultraviolet will be abbreviated as "EUV". An EUV exposure system which uses EUV radiation includes a light source device which outputs EUV radiation and an exposure device which irradiates this EUV radiation upon a mask, thus creating a circuit pattern upon a semiconductor wafer (for example, refer to Patent Reference #1).

Three types of EUV light sources are known: an LPP (Laser Produced Plasma: plasma produced by a laser) type light source; a DPP (Discharge Produced Plasma: plasma produced by a discharge) type light source; and an SR (Synchrotron Radiation) type light source. An LPP type light source is a light source which generates a plasma by irradiating laser radiation upon a target substance, and which employs EUV radiation emitted from this plasma. A DPP type light source is a light source which employs a plasma generated by an electrical discharge. And a SR type light source is a light source which employs radiation emitted from tracks in a synchrotron. Among these three types of light source, there are better possibilities for obtaining EUV radiation of high output with an LPP type light source as compared to the other methods, since such a light source can provide increased plasma density, and since moreover the solid angle over which the radiation is collected can be made large.

Since EUV radiation has a very short wavelength and can easily be absorbed by matter, accordingly the EUV-L technique uses a reflection type optical system. Such a reflection type optical system may be built by employing a multi layer in which, for example, molybdenum (Mo) and silicon (Si) are used. Since the reflectivity of such an Mo/Si multi layer is high in the vicinity of 13.5 nm, accordingly EUV radiation of 13.5 nm wavelength is used in the EUV-L technique.

However, since the reflectivity of such a multi layer is around 70%, therefore the output gradually decreases as the number of reflections increases. Since the EUV radiation is reflected several tens of times within the exposure device, accordingly it is necessary for the EUV light source device to supply EUV radiation to the exposure device at rather high output. Thus, it is expected that the use of LPP type light sources as EUV light source devices will become more common (refer to Patent Reference #2). With an LPP type light source device, liquid droplets of tin (Sn), for example, are supplied as targets within a vacuum chamber from a target supply device, these liquid droplets of tin are converted into plasma by being irradiated with radiation from a carbon dioxide gas laser, and the radiation which is emitted from this plasma is collected by a collector mirror and is conducted to the exposure device.

Now, in an EUV exposure system, it is necessary to supply EUV radiation of rather high purity to the exposure device. If radiation other than EUV radiation is mixed into the radiation which is irradiated upon the mask, then the exposure contrast may be decreased, so that the accuracy of the patterning is deteriorated. For example, the exposure resist which is used in the exposure device is photosensitive to radiation in the wavelength region from 130 nm (DUV: Deep Ultraviolet) to 400 nm (UV: Ultraviolet), so that, if a substantial amount of such radiation is present in the spectrum of the radiation which is emitted from the plasma, this will cause deterioration of the exposure contrast. Moreover, if infrared radiation (IR: Infrared) is present in the radiation from the plasma, then this IR will be absorbed by the mask and the wafer and so on and will cause thermal expansion, so that there is a possibility that the accuracy of the patterning will be decreased.

In particular, in the case of an EUV light source device which uses a carbon dioxide gas pulse laser which emits infrared radiation of wavelength 10.6 μm (hereinafter termed a "$CO_2$ laser") as a light source for exciting a target consisting of tin, since some of the high output of $CO_2$ laser radiation is scattered and reflected by the target, accordingly it is necessary to eliminate this scattered $CO_2$ laser radiation. For example, if the intensity of the EUV radiation centered around the wavelength of 13.5 nm is taken as unity, then it is necessary to keep down the intensity of the $CO_2$ laser radiation included therein to 0.01 or less.

Thus, in a third prior art technique (refer to Patent Reference #3), a reflective type planar diffraction lattice is provided which separates the EUV radiation from radiation of other wavelengths, and only the EUV radiation is supplied. The radiation of other wavelengths outside the EUV region is absorbed by a dumper and is converted into thermal energy.

In the case of an SPF (Spectrum Purity Filter) which uses a reflective type diffraction lattice, it is necessary to provide blazed grooves in order to enhance the efficiency of diffraction of EUV radiation. However, since it is necessary to form extremely minute grooves whose heights are several tens of nanometers at a pitch of a few μm in order to eliminate aberration of the resulting diffracted EUV radiation, accordingly curved grooves are required whose pitch changes (refer to Non-Patent Reference #1).

Thus, as described in a fourth prior art document (refer to Patent Reference #4), it is proposed to create a reflective type SPF by processing an Mo/Si multi layer which has been coated onto the front surface of a mirror into the shapes of blazed grooves.

Patent Reference #1: Japanese Laid-Open Patent Publication 2005-64135.

Patent Reference #2: Japanese Laid-Open Patent Publication 2006-80255.
Patent Reference #3: U.S. Pat. No. 6,469,827.
Patent Reference #4: U.S. Pat. No. 7,050,237.
Non-Patent Reference #1: "EUV spectral purity filter: optical and mechanical design, grating fabrication, and testing", H. Kierey et al., "Advances in Mirror Technology for X-Ray, EUV-Lithography, Laser and Other Applications", edited by Ali M. Khounsary, Udo Dinnger, and Kazuya Ohta, Proceedings of SPIE, Vol. 5193.

SUMMARY OF THE INVENTION

The second problem is that, with the prior art technique described above in which the multi layer is subjected to blazing processing, it is necessary to superimpose a total of 2000 or more of the Mo/Si multi layers. This is because, in order reliably to separate the radiation into diffracted EUV radiation and regularly reflected radiation of other wavelengths, the blaze angle must be set to be large. And, in order to make the blaze angle large in this manner, it becomes necessary to provide 2000 or more multi layers.

Moreover, if a thin layer film type SPF is used, the transmission efficiency for EUV radiation is decreased, since the transmittivity for EUV radiation is low. Moreover, in the case of such a thin layer film type SPF, there is a possibility of deformation or damage due to the absorption of infrared radiation and the like, and accordingly the reliability and the convenience of use are low.

The present invention has been conceived in view of the problems described above, and an objective thereof is to provide a semiconductor exposure device, which can irradiate extreme ultra violet radiation of high purity upon a mask. Another objective of the present invention is to provide such a semiconductor exposure device, which, by using a mirror which is made by laminating together a plurality of regions in which the numbers and shapes of the multi layers are different, makes it possible to enhance the purity of the extreme ultra violet radiation by utilizing beneficial diffraction effects of several types. Yet further objectives of the present invention will become clear from the subsequent description of certain embodiments thereof.

In order to solve the problems described above, a semiconductor exposure device according to a first aspect of the present invention includes an illumination optical system which utilizes extreme ultra violet radiation, and: the illumination optical system includes a plurality of mirrors for extreme ultra violet radiation which reflect the extreme ultra violet radiation, and at least one of the mirrors for extreme ultra violet radiation separates extreme ultra violet radiation from radiation of other wavelengths, and includes: a substrate portion; a foundation portion formed from a first multi layer which is provided on one side of the substrate portion; and a reflecting portion made by forming grooves of predetermined shapes in a second multi layer which is integrally provided on the other side of the first multi layer from the substrate portion.

The one mirror for extreme ultra violet radiation may be formed as having a concave surface which reflects incident extreme ultra violet radiation as almost parallel radiation.

Or, the one mirror for extreme ultra violet radiation may be formed as having a planar surface which reflects incident extreme ultra violet radiation.

The illumination optical system may include an intermediate focus point at which the extreme ultra violet radiation is focused, and a radiation shield member, having an aperture portion which allows the passage of the extreme ultra violet radiation, may be provided in the neighborhood of the intermediate focus point.

The first multi layer and the second multi layer may be formed integrally from a plurality of pair layers, with the thickness dimension of the plurality of pair layers which constitute each of the first multi layer and the second multi layer being set according to the angle at which extreme ultra violet radiation is incident thereupon.

The grooves of predetermined shape may be made as blazed grooves. Or, the grooves of predetermined shape may be made as triangular roof-like grooves. Or, the grooves of predetermined shape may be made as undulating wave-like grooves.

And the grooves of predetermined shape may be provided as concentric circles or parallel lines.

The total number of pair layers which constitute the combination of the first multi layer and the second multi layer may be in the range from 100 to 1000.

And a semiconductor exposure device according to a second aspect of the present invention includes an illumination optical system which utilizes extreme ultra violet radiation, and also includes: a chamber connected to the output side of a light source device which outputs extreme ultra violet radiation; a first mirror which reflects extreme ultra violet radiation incident from the light source device as parallel radiation; a second mirror upon which the extreme ultra violet radiation reflected by the first mirror is incident, and which makes the intensity of the extreme ultra violet radiation uniform; a third mirror which condenses the extreme ultra violet radiation whose intensity has been made uniform, and irradiates it upon a mask; and a radiation shield member, provided at a position between the second mirror and the third mirror, or at a position between the first mirror and the second mirror, and which absorbs or attenuates radiation of other wavelengths than the extreme ultra violet radiation; with the first mirror including: a substrate portion; a foundation portion formed from a first multi layer which is provided on one side of the substrate portion; and a reflecting portion made by forming grooves of predetermined shapes in a second multi layer which is integrally provided on the other side of the first multi layer from the substrate portion.

The first mirror may be provided so that the angle of incidence thereupon of the extreme ultra violet radiation is in the range from 0° to 30°, or in the range from 60° to 80°.

The radiation shield member may be built as a pinhole member which allows the passage only of the extreme ultra violet radiation, while absorbing or attenuating the radiation of other wavelengths.

The radiation shield member may be built as a dumper member which absorbs the radiation of other wavelengths.

Moreover, a semiconductor exposure device according to a third aspect of the present invention includes an illumination optical system which utilizes extreme ultra violet radiation, and also includes: a chamber connected to the output side of a light source device which outputs extreme ultra violet radiation; a first mirror which reflects extreme ultra violet radiation incident from the light source device as parallel radiation; a second mirror upon which the extreme ultra violet radiation reflected by the first mirror is incident, and which makes the intensity of the extreme ultra violet radiation uniform; a third mirror which condenses the extreme ultra violet radiation whose intensity has been made uniform, and irradiates it upon a mask; a fourth mirror which is provided between the output side of the light source device and the first mirror, and which reflects extreme ultra violet radiation incident from the light source device towards the first mirror, and a radiation shield member, provided at a position between the second mirror and the third mirror, which absorbs or attenuates radiation of other wavelengths than the extreme ultra violet radiation; and the fourth mirror includes: a substrate portion; a foundation portion formed from a first multi layer which is provided on one side of the substrate portion; and a reflecting portion made by forming grooves of predetermined shapes in a second multi layer which is integrally provided on the other side of the first multi layer from the substrate portion.

BRIEF DESCRIPTION OF THE DRAWINGS

FIG. 18 is an explanatory figure showing a method of manufacturing a mirror according to a seventh embodiment;

DESCRIPTION OF THE SPECIFIC EMBODIMENTS

In the following, various embodiments of the present invention will be described in detail with reference to the drawings. In these embodiments, as an example, an exposure system 1 which utilizes EUV radiation will be explained. And, as will be explained hereinafter, in these embodiments, a mirror 510 which is included in an illumination optical system 500 of an exposure device 3 will be shown as an example of a mirror which reflects EUV radiation. In these embodiments, a reflective type diffraction lattice is integrally provided in this mirror 510 within this illumination optical system. Due to this, this mirror 510 is simultaneously endowed with its basic function and with a function of serving as a SPF. The basic function of this mirror 510 is to reflect EUV radiation which is incident thereon as parallel rays. In these embodiments, by providing grooves of predetermined shapes in the multi layers upon the collector mirror 510, it is possible to utilize three types of diffraction operation: Bragg reflection by the multi layers of the foundation portion and by the multi layers of the portion in which the grooves of predetermined shape are provided; diffraction due to the repeated pattern of the multi layers which emerges at the front surfaces of the grooves of predetermined shape; and diffraction due to the grooves of predetermined shape themselves. In these embodiments, as examples of these grooves of predetermined shapes, grooves shaped as blazed, triangular roof-like grooves, and undulating wave-like grooves will be explained.

Embodiment 1

Figure 1:
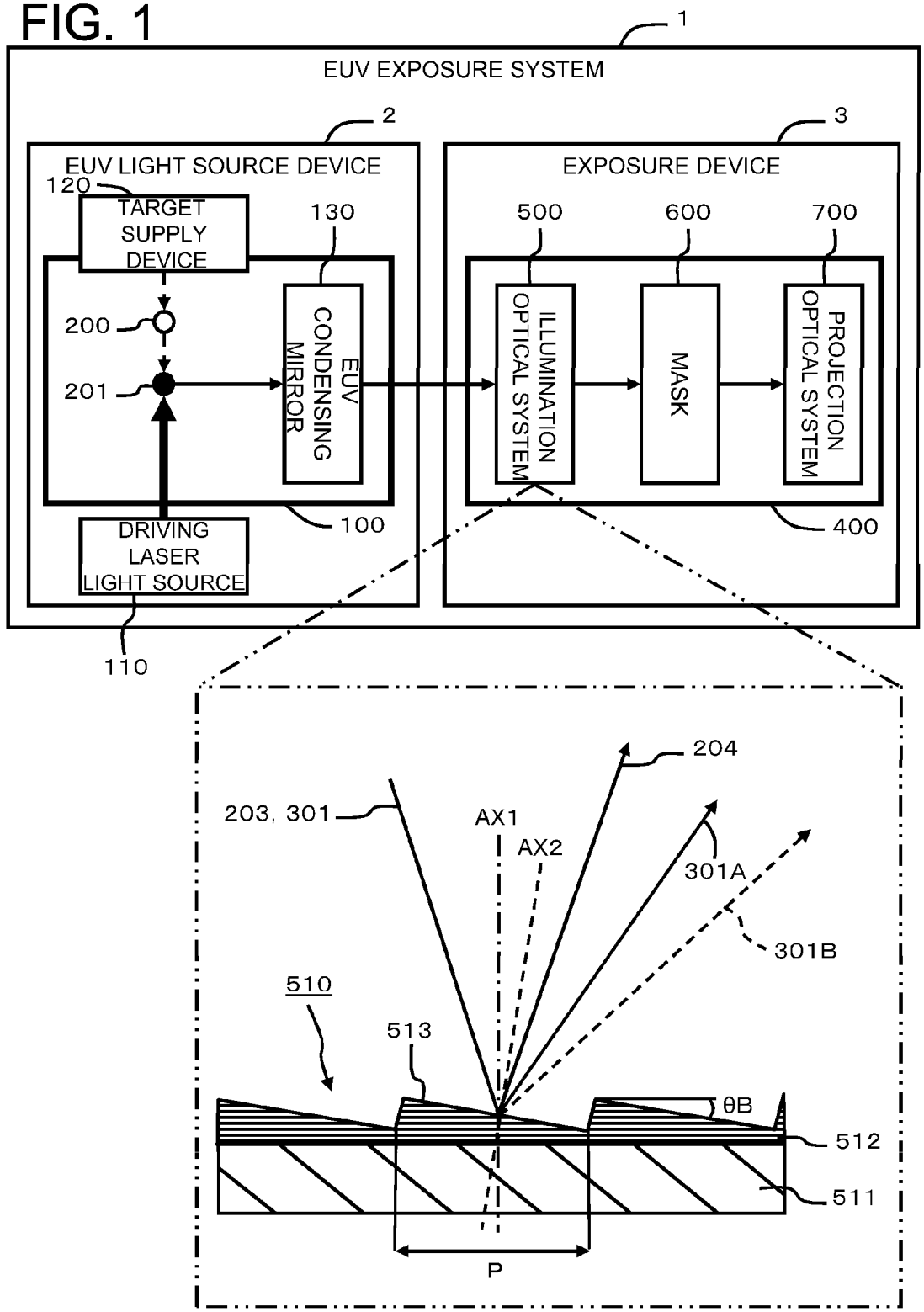
FIG. 1 is an explanatory figure showing the overall structure of an EUV exposure system.

A first embodiment will now be explained with reference to FIGS. 1 through 10. FIG. 1 is an explanatory figure, schematically showing the overall structure of an EUV exposure system 1. This exposure system 1, for example, comprises an EUV light source device 2 and an exposure device 3.

The details of the EUV light source device 2 will be described in more detail subsequently, but now a first summary will be given. The EUV light source device 2 is a device which generates EUV radiation and supplies it to the exposure device 3. A target supply device 120 supplies a target 200 made from tin or the like into a vacuum chamber 100. A driver laser light source 110 irradiates a driver laser upon the target 200 and converts it into plasma 201. The EUV radiation which is generated from this plasma 201 is collected by an EUV collector mirror 130 and is conducted towards the exposure device 3.

The exposure device 3 comprises, for example, an illumination optical system 500, a mask 600, and a projection optical system 700. The illumination optical system 500 is an optical system for causing the EUV radiation supplied from the EUV light source device 2 to be incident upon the mask 600, and comprises a plurality of mirrors. A circuit pattern is formed upon the mask 600. The projection optical system 700 is an optical system for creating a circuit pattern by conducting EUV radiation which has been reflected by the mask 600 so that it is incident upon a semiconductor wafer.

As shown in magnified view at the lower portion of FIG. 1, in this embodiment, upon at least one mirror 510 among the plurality of mirrors which are incorporated in the illumination optical system 500, there are integrally formed a flat foundation portion 512, and a reflecting portion 513 which is formed with grooves of predetermined shapes. This mirror 510 is built so that the direction of the EUV radiation 204 which is reflected is different from the directions of rays of reflected radiation 301A and 301B which are radiation other than EUV radiation (sometimes herein this other type of radiation is generally referred to by the reference symbol 301). Due to this, the reflected EUV radiation 204 is separated from the reflected radiation 301A and 301B which is not EUV radiation, so that it is arranged for only the EUV radiation to be emitted towards the mask 600.

Figure 2:
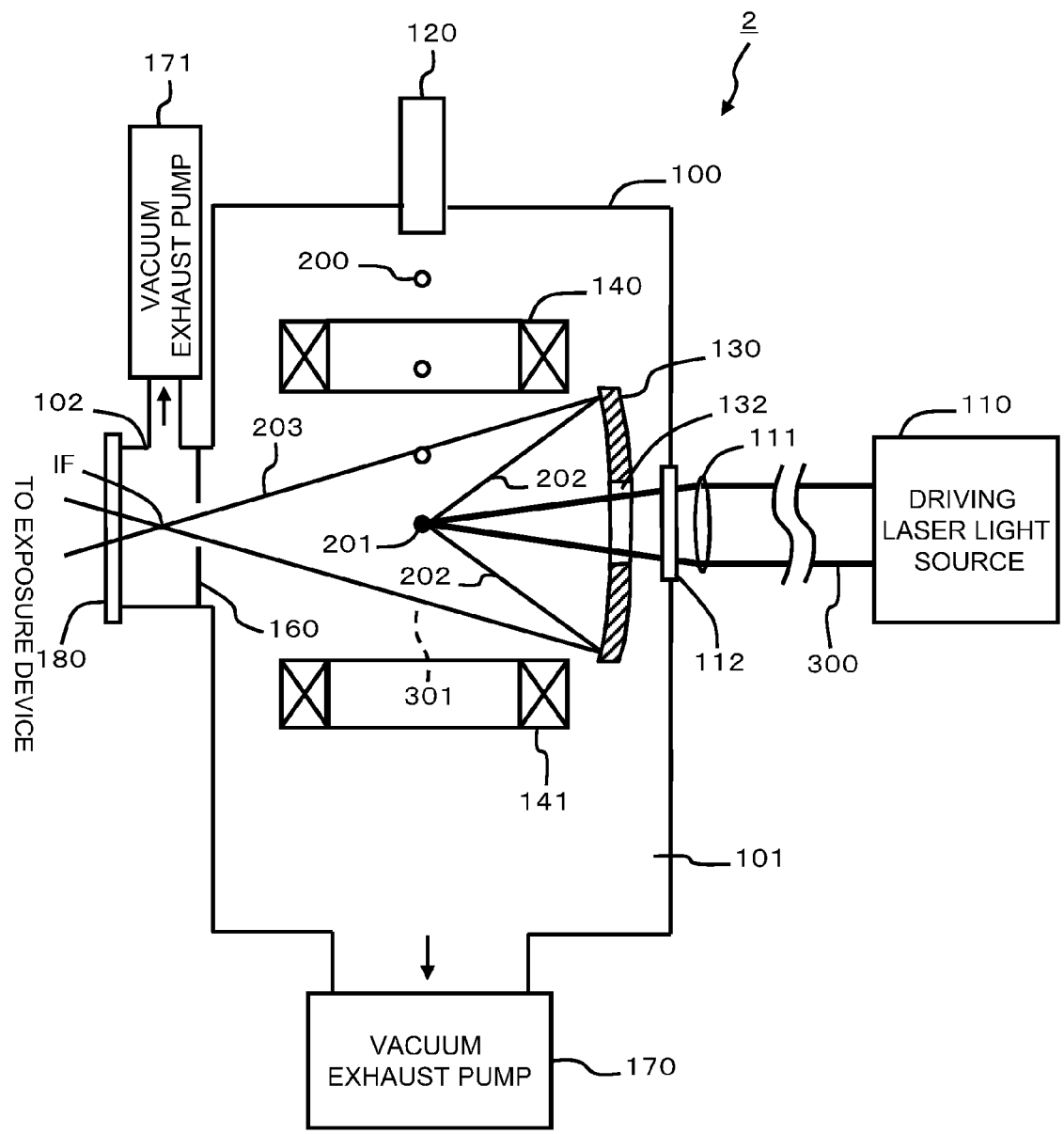
FIG. 2 is an explanatory figure showing an EUV light source device.

The structure of the EUV light source device 2 will now be explained with reference to FIG. 2. As will be described hereinafter, this EUV light source device 2, for example, comprises a vacuum chamber 100, a driver laser light source 110, a target supply device 120, the EUV collector mirror 130, coils for magnetic field generation 140 and 141, an aperture member 160, vacuum exhaust pumps 170 and 171, and a gate valve 180.

The vacuum chamber 100 is made by connected together a first chamber 101 whose volume is relatively large, and a second chamber 102 whose volume is relatively small. The first chamber 101 is a main chamber in which generation of plasma and so on is performed. And the second chamber 102 is a connection chamber, and is for supplying the EUV radiation emitted from the plasma to the exposure device.

The first vacuum exhaust pump 170 is connected to the first chamber 101, and the second vacuum exhaust pump 171 is connected to the second chamber 102. Due to this, each of these chambers 101 and 102 is maintained in a vacuum state. It would be acceptable to constitute each of these vacuum exhaust pumps 170 and 171 as a separate pump, or alternatively to constitute them as one single combined pump.

The target supply device 120 supplies targets 200 as droplets of solid or liquid by, for example, applying heat to a material such as tin (Sn) or the like and melting it. It should be understood that while, in this explanation of the first embodiment, tin is suggested as an example of a target substance, this is not limitative of the present invention; it would also be acceptable to utilize some other substance, such as, for example, lithium (Li) or the like. Or, it would also be acceptable to provide a structure in which targets are supplied in any one of the gaseous, liquid, or solid state, using a material such as argon (Ar), xenon (Xe), krypton (Kr), water, alcohol, or the like. Furthermore, it would also be acceptable to supply targets consisting of liquid or frozen droplets of stannane ($SnH_4$), tin tetrachloride ($SnCl_4$), or the like.

The driver laser light source 110 outputs laser pulses for exciting the targets 200 which are supplied from the target supply device 120. This driver laser light source 110 may, for example, consist of a $CO_2$ (carbon dioxide gas) pulse laser light source. The driver laser light source 110 may, for example, emit laser radiation with the specification of: wavelength 10.6 μm, output 20 kW, pulse repetition frequency 100 khZ, and pulse width 20 nsec. It should be understood that, while a $CO_2$ pulse laser is suggested here as an example of a laser light source, this should not be considered as being limitative of the present invention.

The laser radiation for excitement which is outputted from the driver laser light source 110 is incident into the first chamber 101 via the collector lens 111 and the incidence window 112. This laser radiation which is incident into the first chamber 101 irradiates a target 200 which is supplied from the target supply device 120, via an incidence aperture 132 which is provided to the EUV collector mirror 130.

When the laser radiation irradiates the target, a target plasma 201 is generated. In the following, for convenience, this will simply be termed the "plasma 201". This plasma 201 emits EUV radiation 202 centered around the wavelength of 13.5 nm. This EUV radiation 202 which has been emitted from the plasma 201 is incident upon the EUV collector mirror 130, and is reflected thereby. The reflected radiation 203 is focused at an intermediate focus point (IF: Intermediate Focus) which is a focal point. And this EUV radiation which has thus been focused at the focus point IF is conducted to the exposure device via the gate valve 180, which is in its opened state.

The aperture member 160 is provided in the neighborhood of the focus point IF, so as to separate between the first chamber 101 and the second chamber 102. This aperture member 160 may, for example, be made as a plate shaped member which is provided with a small aperture. The body of this aperture member 160 absorbs radiation other than EUV radiation (such as DUV, UV, VIS (visible light), and IR) and converts it to heat. Due to this aperture member 160, the penetration of radiation other than EUV radiation, and of debris, to the side of the exposure device 3 is prevented as much as possible.

A pair of coils 140 and 141 for magnetic field generation are provided above and below the optical path which the EUV radiation 202 and 203 pursues from the plasma 201 via the EUV collector mirror 130 towards the focus point IF. The axes of these two coils 140 and 141 coincide. Each of the coils 140 and 141, for example, may consist of an electromagnet which has a superconducting coil. When electrical currents flow in the same direction in both of the coils 140 and 141, a magnetic field is generated. This magnetic field has high magnetic flux density in the neighborhoods of the coils 140 and 141, and has a lower magnetic flux density at points intermediate between the coils 140 and 141.

When the laser radiation is irradiated upon the target, debris is created. Debris which carries electric charge (ions such as plasma and so on) is captured by the magnetic field generated by the coils 140 and 141, and moves downward in FIG. 1 while executing helical motion due to Lorentz force. This debris which has moved downwards is sucked out by the first vacuum exhaust pump 170 and is exhausted to the exterior of the first chamber 101. The position at which the magnetic field generation device (in this embodiment, the coils 140 and 141) is installed should be a position at which the ionized debris can be discharged by the magnetic flux generated by the device, while avoiding the various optical components of the system. Accordingly, the configuration shown in the figure should not be considered as being limitative of the present invention.

It would also be acceptable to arrange for the magnetic flux density of one or the other of the coils 140 and 141 to be relatively weaker, so that the debris which carries electrical charge flows towards that one thereof where the magnetic flux density is the lower.

For convenience, explanation of the power supply device and the wiring which supply electrical current to the coils 140 and 141, and of the mechanisms for cooling the aperture member 160 and the EUV collector mirror 130 and so on, will herein be omitted, and moreover these elements are not shown in the figures. However, without undue experimentation, a person of ordinary skill in the art will be able to design a suitable such power supply construction and a suitable such cooling construction based upon the disclosure in this specification, and will also be able actually to manufacture them.

A high vacuum state is maintained within the first chamber 101 by the first vacuum exhaust pump 170, and a vacuum state is maintained within the second chamber 102 by the second vacuum exhaust pump 171. The pressure within the first chamber 101 is set to be lower than the pressure within the second chamber 102. Moreover, the ions (i.e. the electrified debris particles) within the first chamber 101 are captured by the magnetic field which is generated by the coils 140 and 141.

Accordingly, it is possible to prevent any of the debris which is created within the first chamber 101 from getting into the second chamber 102. Moreover, even if some debris or the like should get into the second chamber 102, nevertheless, due to the operation of the second vacuum exhaust pump 171, it is possible to extract this debris or the like to the exterior of the second chamber 102. Because of this structure, it is possible effectively to prevent any debris or the like from getting into the exposure device.

Thus, in this embodiment, the magnetic field which is created by the coils 140 and 141 is utilized as a protection means for protecting the various optical elements from debris. These various optical elements include the EUV collector mirror 130, the incidence window 112, incidence windows for optical sensors of various types (not particularly shown) which are provided for observing phenomena within the vacuum chamber 100, and so on.

Since the ions in the debris which is emitted from the plasma 201 are electrically charged, they are captured by the magnetic field and are discharged by the first vacuum exhaust pump 170. However, neutral debris which is not electrically charged is not constrained by the magnetic field.

Accordingly, if no particular countermeasures were to be instituted, this neutral debris gradually contaminates the various optical elements within the vacuum chamber 100 and damages them. Moreover, if and when such neutral debris within the first chamber 101 gets into the exposure device via the second chamber 102, it may also even contaminate the various optical elements within the exposure device.

By contrast, in this embodiment, the construction is such that the vacuum chamber 100 is subdivided into the first chamber 101 whose volume is relatively greater and the second chamber 102 whose volume is relatively smaller, and moreover the pressure within the first chamber 101 is set to be lower than the pressure within the second chamber 102. Furthermore, the aperture member 160 is provided so as to separate between the first chamber 101 and the second chamber 102, so that, in addition to limiting spatial migration from the first chamber 101 and the second chamber 102, the probability of neutral debris getting into the second chamber 102 from the first chamber 101 is reduced. Even if neutral debris should get into the second chamber 102, this debris will be discharged to the exterior by the second vacuum exhaust pump 171. Accordingly, in this embodiment, it is possible to prevent debris within the EUV light source device 2 from getting into the exposure device, before it even happens.

Although it is possible to prevent the exposure device from being contaminated by debris, neutral debris gradually diffuses and piles up within the vacuum chamber 100. Accordingly, depending upon the time period which elapses, there is a possibility that the front surface 131 of the EUV collector mirror 130 may gradually become contaminated by debris. In this case, maintenance work should be performed.

In such maintenance work, for example, the operation of the EUV light source device 1 is stopped, the gate valve 180 is closed so as perfectly to intercept communication between the exposure device and the vacuum chamber 100, and the EUV collector mirror 130 is cleaned with an etchant gas.

For example, hydrogen gas, a halogen gas, a hydrogenated halogen gas, argon gas, or a mixture thereof may be used as the etchant gas. The EUV collector mirror 130 could also be heated by a heat application device not shown in the figures, in order to promote the cleaning thereof. Moreover, it might also be arranged to excite the etchant gas with RF (Radio Frequency) radiation or with microwaves, in order to promote the cleaning.

When the cleaning has been completed, the supply of the etchant gas to the vacuum chamber 100 is stopped, and, after a sufficient level of vacuum has been established by the vacuum exhaust pumps 170 and 171, the gate valve 180 is opened, and the operation of the EUV light source device 2 is resumed.

Figure 3:
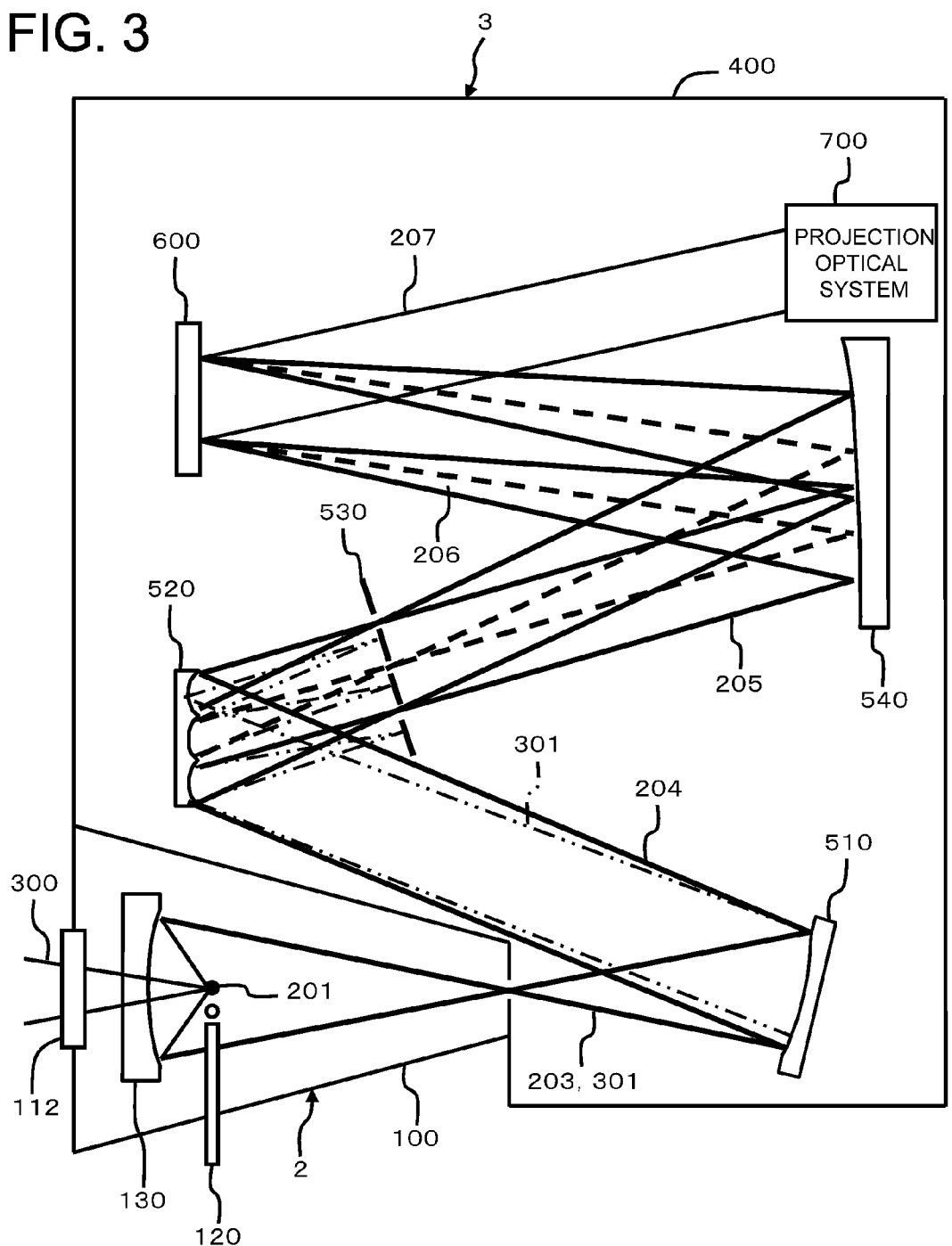
FIG. 3 is an explanatory figure showing the structure of an exposure device.

FIG. 3 is an explanatory figure showing the structure of the exposure device 3. The following explanation will focus upon the illumination optical system 500. The illumination optical system 500, the mask 600, and the projection optical system 700 are provided within a chamber 400 of the exposure device 3. As explained with reference to FIG. 2, the chamber 100 of the EUV light source device 2 is connected to the chamber 400 via the gate valve 180.

The illumination optical system 500, for example, may include a collimator mirror 510, a fly-eye mirror array 520, a pinhole array 530, and a condenser mirror 540. This collimator mirror 510 is a mirror for reflecting EUV radiation 203 which is incident thereon from the EUV light source device 2 as parallel radiation. In some cases, the condenser mirror 130 within the EUV light source device 2 is termed the "C1 mirror", while the collimator mirror 510 within the illumination optical system 500 is termed the "C2 mirror".

As well as including the EUV radiation 203, the radiation which is incident from the EUV light source device 2 also includes radiation of other wavelengths. As described above, this radiation of other wavelengths is made up of DUV, UV, VIS, and IR. Moreover, since the $CO_2$ laser radiation for exciting the target is scattered and reflected by the target, some of this $CO_2$ laser radiation is also incident from the EUV light source device 2. Since, as will be described hereinafter, the collimator mirror 510 possesses the structure which is characteristic of the present invention, the direction in which the EUV radiation 204 is reflected is different from the directions 304 in which the radiation 301 other than the EUV radiation is reflected.

Figure 9:
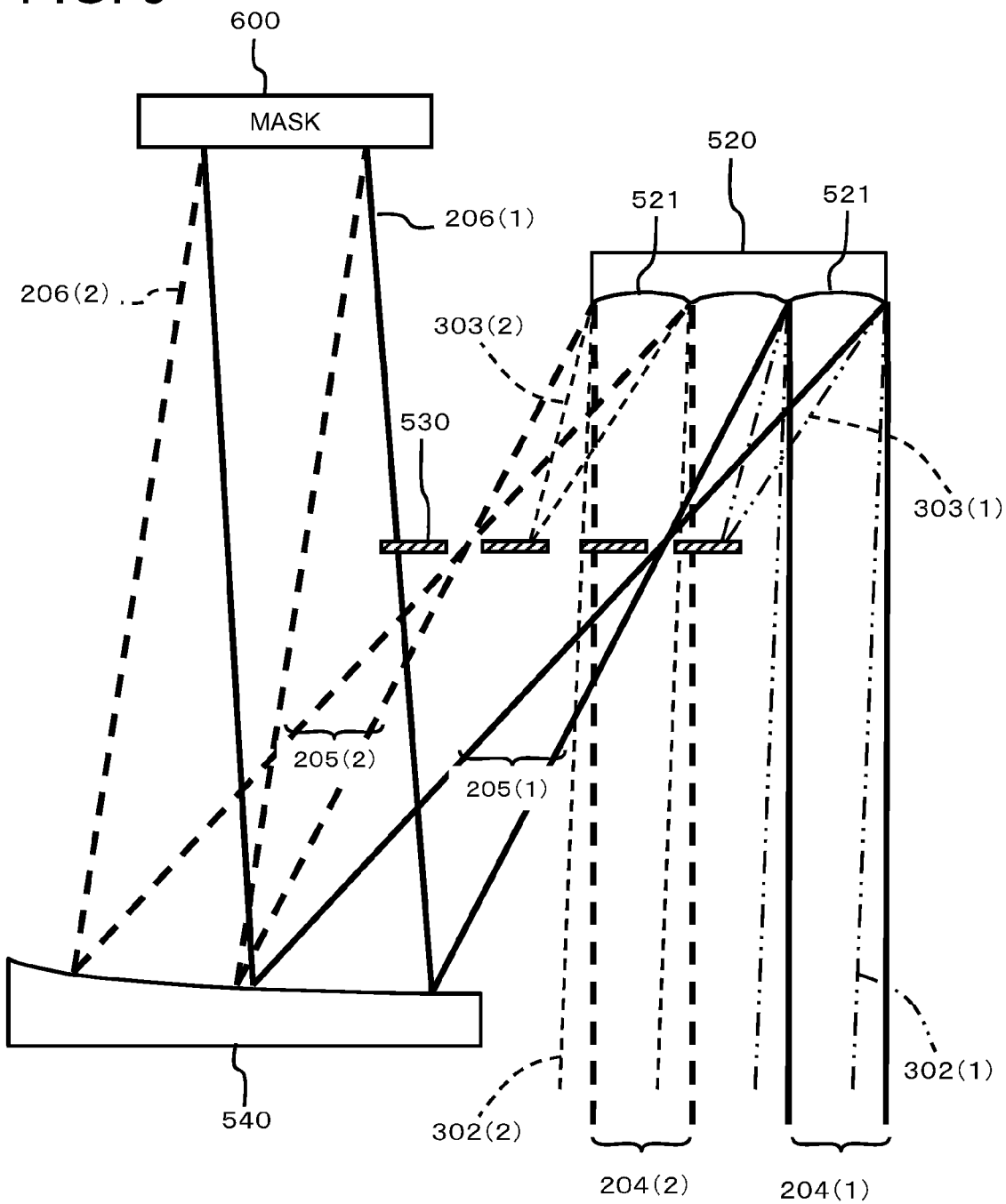
FIG. 9 is an explanatory figure showing the relationship between an optical system for making the intensity of EUV radiation uniform and a pinhole array.
Figure 10:
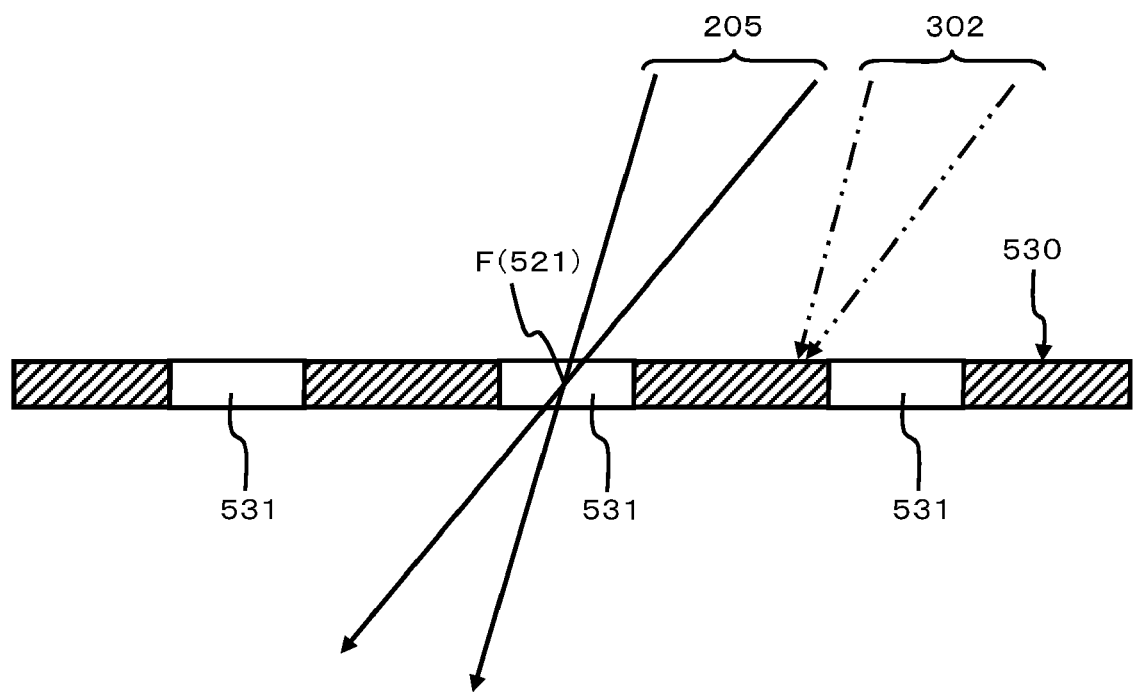
FIG. 10 is an explanatory figure showing the operation of the pinhole array.

The fly-eye mirror array 520 is a mirror array in which a plurality of concave surface mirrors 521 are arranged upon a plane (refer to FIG. 9). This fly-eye mirror array 520 functions as a beam homogenizer. In other words, the fly-eye mirror array 520 makes the intensity of the EUV radiation uniform, and is arranged so as to direct this resulting uniform EUV radiation in a direction to be incident upon the mask 600.

After having been temporarily gathered to a number of focal points by the concave surface mirrors 521 in the fly-eye mirror array 520, the EUV radiation 205 which has been reflected by these concave surface mirrors 521 is then diffused. Thus, in this embodiment, a pinhole array 530 is provided in the neighborhood of the group of focal points of the fly-eye mirror array 520. This group of focal points of the fly-eye mirror array 520 is the set of the focal points of the various concave surface mirrors 521 in the fly-eye mirror array 520. The pinhole array 530 is provided with small apertures which correspond to these focal points of the concave surface mirrors 521.

The condenser mirror 540 is a mirror for reflecting the EUV radiation 205 which is incident from the fly-eye mirror array 520 via the pinhole array 530 towards the mask 600. The EUV radiation 207 which is reflected by the mask 600 proceeds towards the projection optical system 700.

Next, the collimator mirror 510 will be explained with reference to FIGS. 4 through 6. FIG. 6 is an explanatory figure which schematically shows a cross section of the collimator mirror 510. A multi layer which selectively reflects radiation at a predetermined wavelength is formed upon the front surface of the collimator mirror 510. In this embodiment, this predetermined wavelength is 13.5 nm. This multi layer is made by laminating together a large number of pair layers made from molybdenum and silicon (Mo/Si). Moreover, a large number of blazed grooves 513 are formed upon this multi layer which covers the front surface of the mirror 510.

Figure 5:
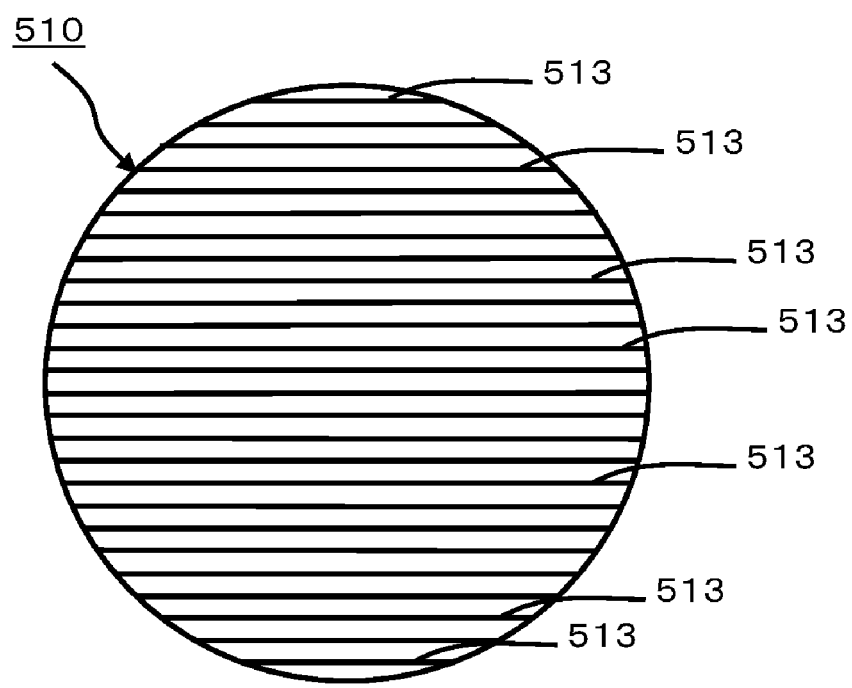
FIG. 5 is a plan view showing these blazed grooves on the mirror.
Figure 6:
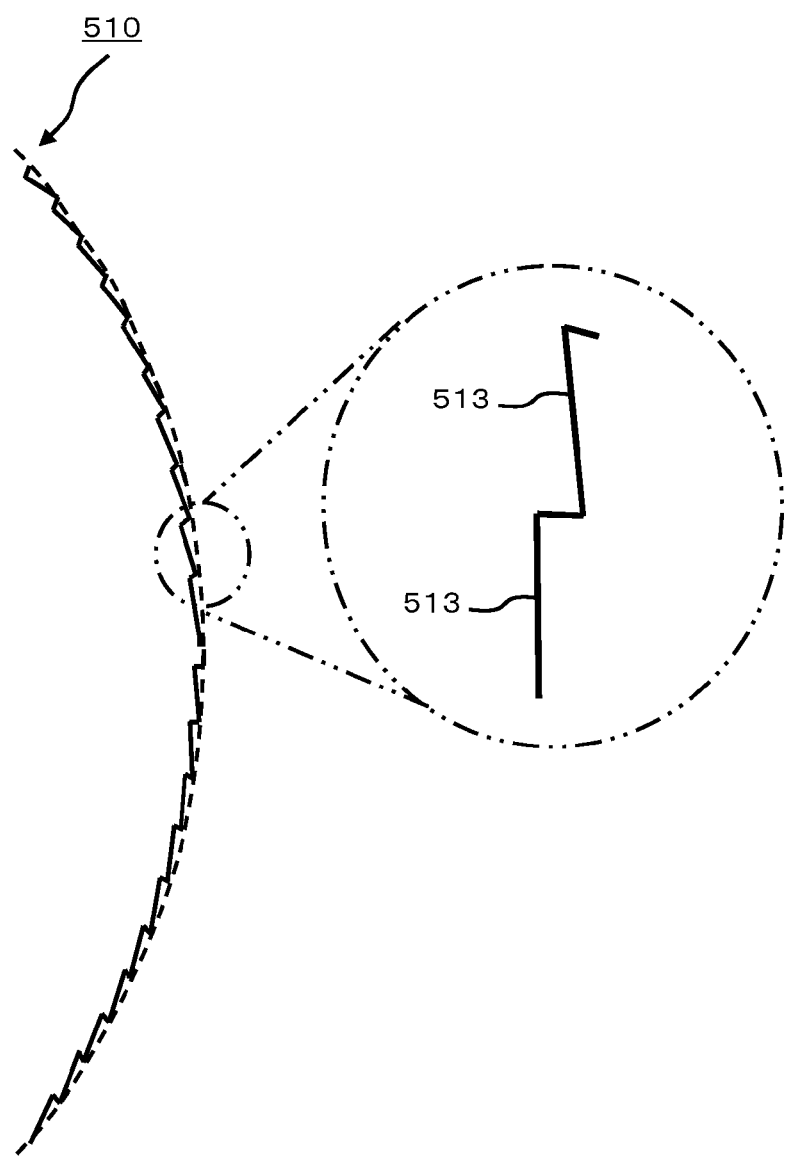
FIG. 6 is an explanatory figure showing the directions of these blazed grooves on the mirror in magnified view.

As shown in the enlarged cross sections of FIGS. 5 and 6, the blazed grooves 513 of this embodiment are formed as parallel straight lines. It should be understood that the shapes of the blazed grooves 513 are not limited to those shown in FIG. 6. As shown in further embodiments which will be described hereinafter, the blazed grooves 513 may be formed in various shapes. Moreover, in this first embodiment, the blazed grooves 513 are formed so that their abrupt step portions face towards the center of the mirror (its central axis), i.e. away from the outer edge of the mirror, while their gently sloping portions face towards the outer edge of the mirror.

Figure 4:
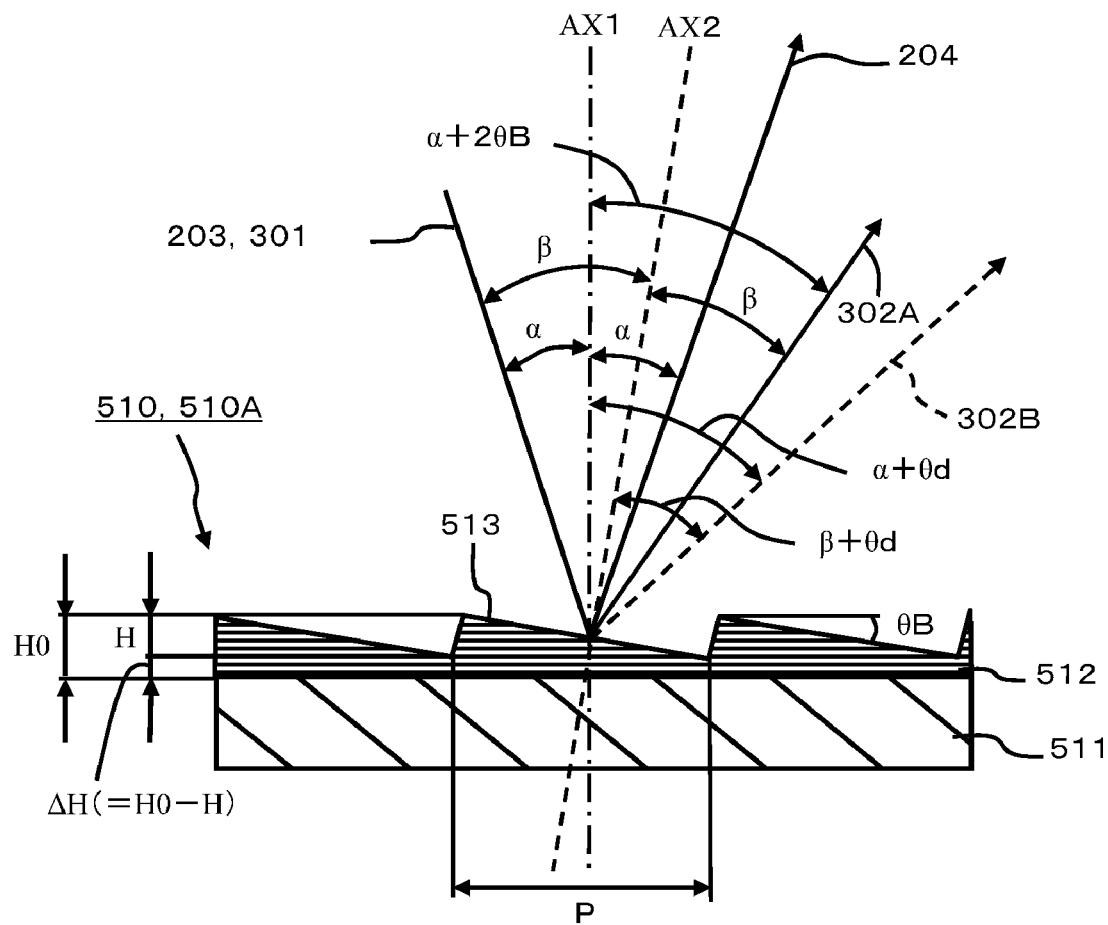
FIG. 4 is a sectional view showing a magnified view of blazed grooves on a mirror.

FIG. 4 is a sectional view showing a portion of the EUV collector mirror in magnified form. In FIG. 3, the axial line AX1 is an axis which is perpendicular to the substrate portion 511 of the collimator mirror 510, while the other axial line AX2 is an axis which is perpendicular to the sloping surface of one of the blazed grooves 513.

The substrate portion 511 of the collimator mirror 510 is made from a material such as, for example, silicon or silicon carbide (SiC) or nickel alloy or the like whose thermal conductivity is good. A predetermined number of multi layers (Mo/Si pair layers) are coated upon the front surface of the substrate portion 511 (which is its upper surface in FIG. 4, and corresponds to "a surface" in the Claims).

In this embodiment, the number of Mo/Si pair layers which are coated upon the substrate portion 511 is in the range from 100 to 1000. And desirably, in this embodiment, around 300 of these Mo/Si pair layers should be laid over one another upon the front surface of the substrate portion 511. Each of these Mo/Si pair layers is a pair layer which consists of one molybdenum layer and one silicon layer, and the multi layer is made by laminating together a large number of such Mo/Si pair layers.

The blazed grooves 513 are processed (to a depth H) into around 250 of the 300 pair layers of the multi layer upon the mirror front surface (whose total thickness is H0), while the approximately 50 layers at the bottom, which constitute a composite sub-layer) are left just as they are. The approximately 50 pair layers (the composite sub-layer of thickness $\Delta H$) at the bottom of the multi layer correspond to the "first multi layer" of the Claims. A foundation portion 512 is formed from this composite sub-layer of thickness $\Delta H$. In order to cause the EUV radiation to be reflected by this foundation portion 512 by Bragg reflection, this foundation portion 512 should consist of from around 40 to around 60 of the Mo/Si pair layers. The composite sub-layer (of thickness H) consisting of around 250 pair layers which is positioned over the foundation portion 134, and in which the blazed grooves 513 are formed, corresponds to the "second multi layer" of the Claims, while the blazed grooves 513 correspond to the "reflecting portion" of the Claims.

It should be understood that the various numerical values given above for numbers of pair layers (sub-layer thicknesses) of 300, 250, and 50, are only cited by way of example for convenience of explanation; the present invention should not be considered as being limited to these numerical values. Finally, the number of the pair layers may be any value within the range from 100 to 1000, provided that the foundation portion 512 and the reflecting portion are able to manifest the function of reflecting the EUV radiation by Bragg reflection and also the function of regularly reflecting the radiation other than EUV radiation in other directions, while the blazed grooves 133 are able to manifest both the function of diffracting the EUV radiation due to the exposed patterns of the pair layers on the reflecting portions, i.e. on the front surfaces of the blazed grooves, and also the function of diffracting the EUV radiation due to the patterns of the blazed grooves themselves.

If the number of the pair layers is less than 100, then it is not possible to obtain the required blaze angle $\theta B$, so that sometimes it may be the case that it is not possible sufficiently to separate the EUV radiation from the radiation of other wavelengths. By contrast, if the number of the pair layers is greater than 1000, then a great deal of labor must be utilized during fabrication of the mirror, and moreover the internal stress is increased, so that there is a possibility that the multi layer may become detached.

Thus, in this embodiment, as one example of a value between 100 and 1000, the value of 300 is selected for the number of pair layers, and the above described reflective type diffraction lattice made from this number of pair layers is provided integrally upon the collimator mirror 510. The more multi layers are provided as stacked over one another, the greater is it possible to make the blaze angle $\theta B$, so that it is possible to separate the EUV reflected radiation 204 and the radiation 301A and 301B of other wavelengths, in a simple and easy manner.

In this embodiment, it is possible to set the number of Mo/Si pair layers which are laminated together to any value in the range from 100 to 1000, and it is possible to reduce the stress set up in the multi layer, and thus to prevent detachment of the multi layer. Moreover, with regard to the efficiency of reflection of EUV radiation, it is possible to keep the performance around 60% to 70%, which is similar to that of the prior art.

In other words, since the collimator mirror 510 of this first embodiment of the present invention is endowed, not only with its basic function of reflecting EUV radiation into parallel radiation at a reflectivity of around 60% to 70%, but also with the function of acting as a SPF, accordingly the loss of the EUV radiation due to this single reflection is held down to around 30%, which is the same is in the prior art, and moreover the purity of the EUV radiation is enhanced.

It should be understood that it would also be acceptable, after the frontmost surface of the mirror has been processed in order to produce the blazed grooves 513, to coat it with ruthenium (Ru) or the like so that the exposed portion of the Mo/Si layer which has been processed does not become oxidized; and this results in a structure with which decrease of the diffraction efficiency for the EUV radiation is prevented. Moreover, as will be explained hereinafter with reference to FIG. 7, it is desirable for the thicknesses of the Mo/Si pair layers to be set according to the angle of incidence of the EUV radiation.

If the angle of incidence of the EUV radiation 203 which is incident from the plasma 201 upon the collimator mirror 510 shown in FIG. 4 is termed $\alpha$, then the EUV radiation 204 is reflected at almost the angle $\alpha$, to be incident upon the fly-eye mirror array 520 (refer to FIG. 3). By contrast, the DUV, UV, VIS, and IR radiation components (301) such as the $CO_2$ laser radiation are regularly reflected at an angle $\alpha+2\theta\beta$ (302A). Accordingly, at the position of the pinhole array 530 (refer to FIG. 3), the EUV reflected radiation 204 and the regularly reflected radiation such as the $CO_2$ radiation 302A and so on are separated out.

In other words, due to the blazed grooves 513 (whose blaze angle is $\theta B$), with the exception of the EUV radiation 203, the DUV, UV, VIS, and IR are regularly reflected (302A) at the angle of $\alpha+2\theta B$ by the surfaces which are at the angle $\theta B$. Accordingly, it is possible to separate the EUV radiation 204 which is reflected or diffracted at almost the angle $\alpha$ and the other radiation (DUV, UV, VIS, and IR). Additionally, the collimator mirror 510 fulfils the function of an SPF. As will be described hereinafter, the other radiation 302A which proceeds in directions other than that of the EUV radiation 204 is absorbed by the wall portion of the pinhole array 530 (refer to FIG. 3).

Furthermore, IR radiation such as the $CO_2$ laser radiation is diffracted (302B) at an angle of $\alpha+\theta d$ (or $\alpha-\theta d$; not shown in the drawing) by the blazed grooves 513. Since, in this embodiment, the wavelength of the laser radiation is 10.6 μm, and accordingly the angle $\theta d$ in FIG. 4 is 27.6 mrad. In other words, only the EUV radiation 204 is diffracted by just the angle of 27.6 mrad (302B). This diffracted radiation (302B) is also absorbed by the wall portion of the pinhole array 530 (refer to FIG. 3).

Although for the sake of convenience this feature is not shown in the figure, the DUV, UV, and VIS (301) which are incident upon the mirror 510 are diffracted by the gratings which are formed by the periodic stripe patterns of the alternating molybdenum and silicon layers appearing upon the sloping surfaces of the blazed grooves 513 (in this embodiment, these stripe patterns have pitch of 1.54 μm), and follow paths at angles which are different from that of the EUV radiation 204. This diffracted radiation is also absorbed by the wall portion of the pinhole array 530 (refer to FIG. 3). The radiation which, as described above, proceeds after being separated by the mirror 510 at angles which are different from that of the EUV radiation (i.e. the radiation components designated above as 301A and 302B, and the radiation which is diffracted by the periodic stripe patterns of molybdenum and silicon which appear upon the sloping surfaces of the blazed grooves 513) are, as a general term, termed the radiation 302 other than EUV radiation.

Figure 7:
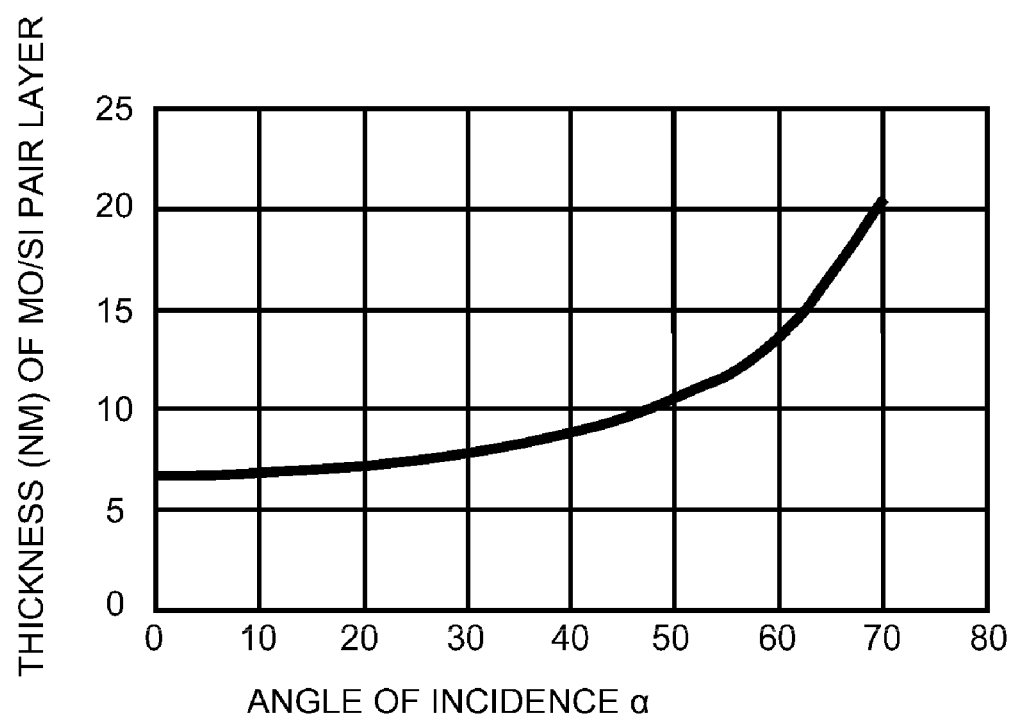
FIG. 7 is a characteristic figure for the setting of Mo/Si pair layer thickness according to the angle of incidence.

FIG. 7 shows a characteristic for setting the thickness of the Mo/Si pair layers according to the angle of incidence ($\alpha$) of the EUV radiation upon the collimator mirror 510. As shown in FIG. 7, as the angle of incidence increases from 0° to 50°, the thickness of the pair layers increases from around 6 nm to around 10 nm. When the angle of incidence $\alpha$ is 12°, the thickness of the pair layers is 6.9 nm. From the general vicinity where the angle of incidence exceeds 50°, the rate of increase of the thickness of the pair layers becomes great. When the angle of incidence is around 70°, the thickness of the pair layers becomes around 20 nm. It should be understood that the characteristic shown in FIG. 7 is only given by way of example; the present invention is not to be considered as being limited to the characteristic shown in FIG. 7.

Figure 8:
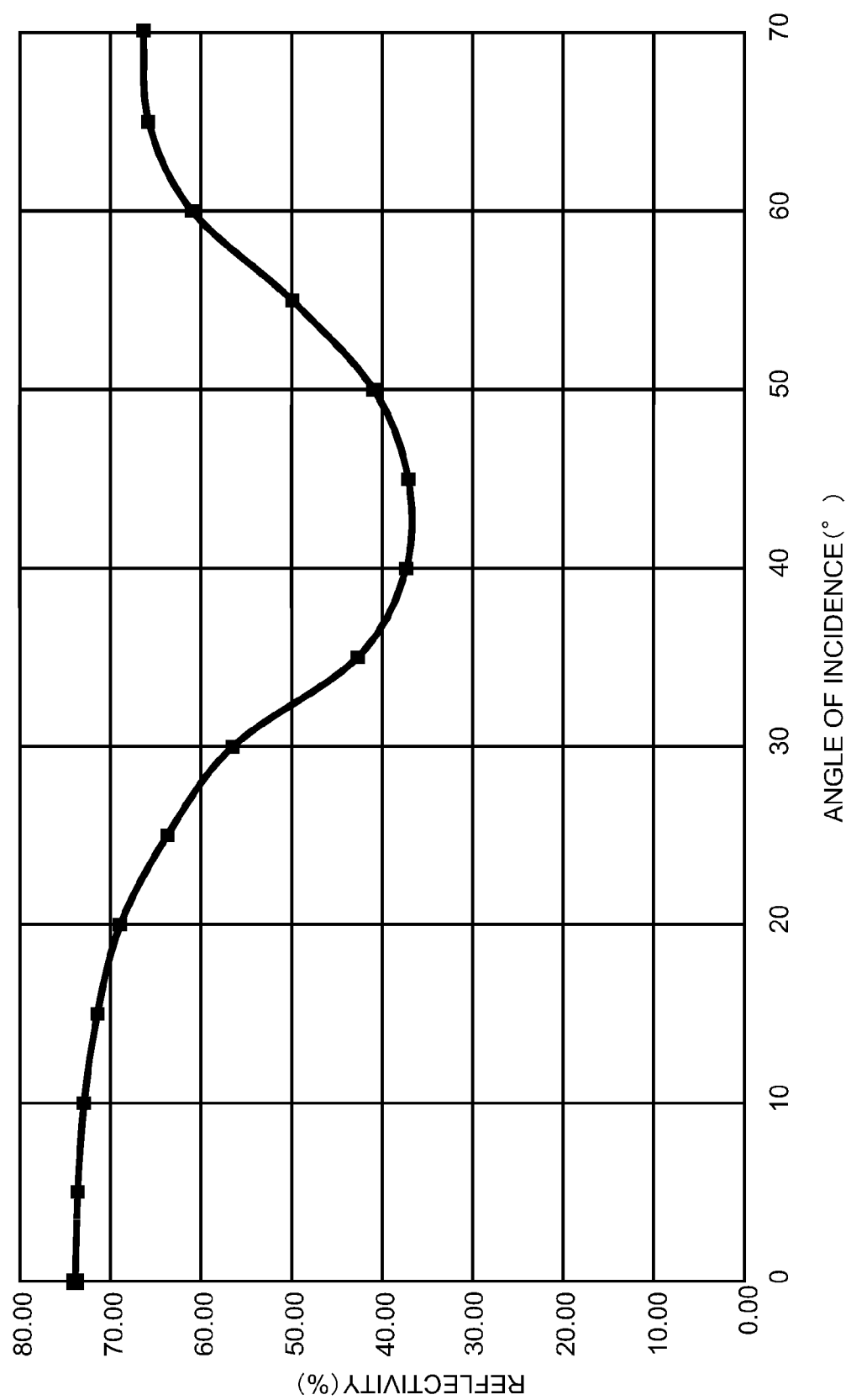
FIG. 8 is a characteristic figure showing the relationship between the angle of incidence of EUV radiation and reflectivity.

FIG. 8 is a graph showing a relationship between the angle of incidence of the EUV radiation 203 and the reflectivity. In FIG. 8, the reflectivity is shown along the vertical axis, while the angle of incidence is shown along the horizontal axis.

In the range of angle of incidence from 0° (perpendicular to the mirror 510) to 20°, the reflectivity gently decreases according to the angle of incidence, from around 75% to around 70%. In the range of angle of incidence from 20° to 30°, the reflectivity decreases according to the angle of incidence from around 70% to around 55%. Moreover, in the range of angle of incidence from 30° to 45°, the reflectivity decreases rather abruptly according to the angle of incidence, from around 55% to around 40%. And, in the range of angle of incidence from 45° to 60°, the reflectivity increases quite steeply according to the angle of incidence, from around 40% to around 60%. Although only angles of incidence up to 70° are shown in FIG. 8, in the range of angle of incidence from 60° to 80°, the reflectivity gently increases from around 60% to around 65%.

Thus, in this embodiment, the angle of the mirror 510 is set so that the angle of incidence of the EUV radiation is in the range from 0° to 30°, or in the range from 60° to 80°. It should be understood that, if the angle of incidence is greater than 80°, then it is not possible for the operation of the present invention for separation of the EUV radiation 203 from the other radiation 301 to take place, because the EUV radiation does not enter into the pair layers.

Since the collimator mirror 510 of this embodiment includes the foundation portion 512 and the blazed grooves 513, both of which are made from a multiple Mo/Si pair layers, accordingly it is capable of providing a plurality of different diffraction operations.

FIG. 9 is an explanatory figure showing the beam homogenizer function performed by the fly-eye mirror array 520, and the operation of the pinhole array 530. The EUV radiation 204 and the other radiation 302 which are reflected by the mirror 510 are both incident upon each of the concave surface mirrors 521 included in the fly-eye mirror array 520.

The radiation 205(1) and 205(2) which has been reflected by these concave surface mirrors 521, after having been gathered together at intermediate focal points, is then incident upon the condenser mirror 540, and is supplied to the mask 600. In other words, the radiation 205(1) and 205(2) which is reflected by the concave surface mirrors 521 is reflected by the condenser mirror 540 (as the radiation 206(1) and 206(2)), and then is illuminated upon the front surface of the mask 600. Due to this, it is possible to make the intensity of the EUV radiation which is incident upon the mask 600 uniform.

In FIG. 9, the EUV radiation 204(1) is EUV radiation which is incident upon a concave surface mirror 521 on the right side, while the EUV radiation 204(2) is EUV radiation which is incident upon a concave surface mirror 521 on the left side. In a similar manner, the reference symbol 302(1) is appended to the other radiation which is incident upon this concave surface mirror 521 on the right side, while the reference symbol 302(2) is appended to the other radiation which is incident upon the concave surface mirror 521 on the left side. For convenience, radiation incident upon the concave surface mirrors 521 in the center is not shown in the figure.

And the pinhole array 530 is disposed at the position of the group of focus points at which the concave surface mirrors 521 of the fly-eye mirror array 520 are focused. As shown in the enlarged view of FIG. 10, the positions of the focus points F(521) of the concave surface mirrors 521 and of the pinholes 531 coincide with one another. The EUV radiation 205 which arrives from the concave surface mirrors 521 passes through the pinholes 531, while the radiation 302 other than the EUV radiation is intercepted by the wall portion of the pinhole array 530. In other words, it is possible to ensure than only the EUV radiation 204 whose direction has been separated out by the mirror 510 is allowed to be incident upon the condenser mirror 540, while the radiation 301 other than the EUV radiation can be intercepted by the wall portions of the pinhole array 530 and is converted to heat. This is accomplished by the collimator mirror 510 being endowed with the additional function of acting as an SPF.

With this embodiment which has the structure described above, since the blazed grooves 513 are formed by processing the sub-layer of the collimator mirror 510 which is made by superimposing a predetermined number of Mo/Si pair layers, accordingly not only can the collimator mirror 510 be endowed with its basic function of reflecting the EUV radiation, but also with the function of acting as an SPF which separates the EUV radiation from the radiation of other wavelengths. Furthermore, in this embodiment, since the pinhole array 530 is provided between the fly-eye mirror array 520 and the condenser mirror 540, accordingly it is possible to supply only the EUV radiation to the mask 600. Due to this, in this embodiment, it is possible to supply a greater proportion of the EUV radiation to the mask 600, as compared to the case in which a separate reflective type diffraction lattice is used, and moreover it is possible to reduce the number of components in the exposure device 3, thus keeping its manufacturing cost low.

In this embodiment, the blazed grooves 513 are formed by laminating a number of Mo/Si pair layers in the range of 100 to 1000 upon the substrate portion 511. Accordingly, as compared with a prior art technique in which 2000 or more Mo/Si pair layers were superimposed, the stress in the multi layer is reduced, so that there is no fear that the multi layer may become detached due to such stress, and accordingly the reliability and the convenience of use are enhanced. Moreover, since the number of layers is reduced, accordingly the manufacturing cost of this collimator mirror 510 can also be reduced.

Since, in this embodiment, the collimator mirror 510 is endowed with the function of a SPF, accordingly it is possible to provide the exposure device with EUV radiation of high purity which has been subjected to only a single reflection. Therefore a higher efficiency can be obtained than in the case of the prior art, in which the EUV radiation was reflected a plurality of times.

Moreover, since the collimator mirror 510 of this first embodiment is utilized in the illumination optical system 500 of the exposure device 3, accordingly it does not experience any influence due to debris. Therefore, even when a mirror of a special type of construction such as that shown in FIG. 4 is employed, it can still be used over the long term.

Embodiment 2

A second embodiment of the present invention will now be explained on the basis of FIGS. 11 through 13. The various embodiments of the present invention which are described below correspond to variants of the first embodiment described above. Accordingly, the explanation thereof will focus upon the aspects in which these embodiments differ from the first embodiment. The aspects of difference between this second embodiment and the first embodiment are that the blazed grooves are formed as concentric circles, that the blazed grooves are formed so that their abrupt step portions face away from the center of the mirror (its central axis) towards the outer edge of the mirror and their gently sloping portions face towards the central axis of the mirror, i.e. so that the blazed grooves are angled in the opposite direction to those of the first embodiment described above, and that, along with this point of difference, a dumper 560 is additionally provided.

Figure 11:
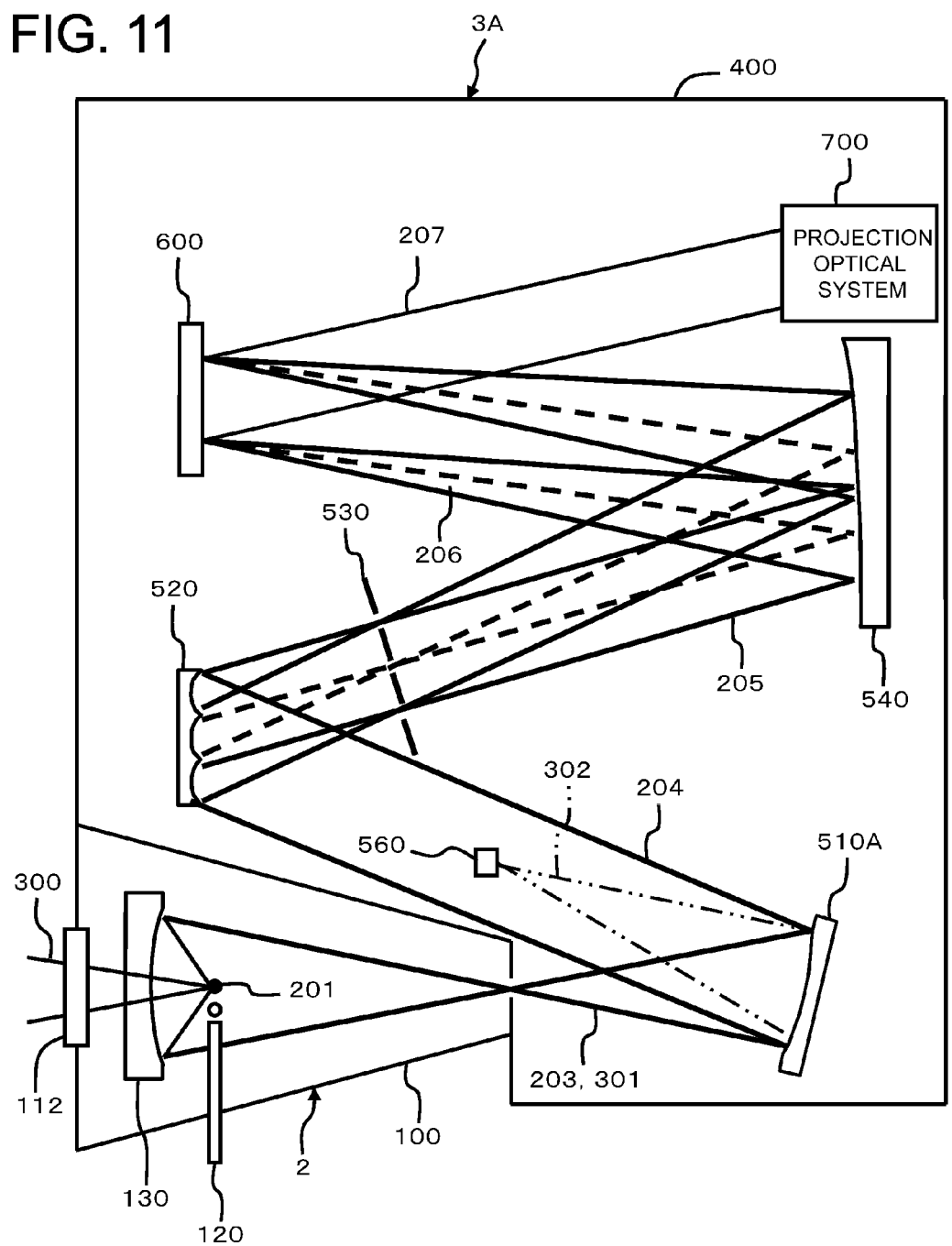
FIG. 11 is an explanatory figure showing an exposure device according to a second embodiment.

FIG. 11 is an explanatory figure showing the exposure device 3A according to this embodiment. The dumper 560 is provided at a position which is between the collimator mirror 510A and the fly-eye mirror array 520, and moreover at the position at which the other non-EUV radiation 302 which is separated out by the mirror 510A which is endowed with the function of acting as a SPF is collected together. This dumper 560 absorbs the radiation 302, such as the laser radiation, in wavelength regions other than the EUV radiation, which has been deflected by the blazed grooves 513, and converts it to thermal energy. It is desirable for the dumper 560 to be cooled by some cooling mechanism such as a water cooling jacket or the like. On the other hand, for the EUV radiation 203, the mirror 510A functions like a C2 mirror in the prior art, and reflects this EUV radiation 203 and converts it to parallel radiation 204.

Figure 12:
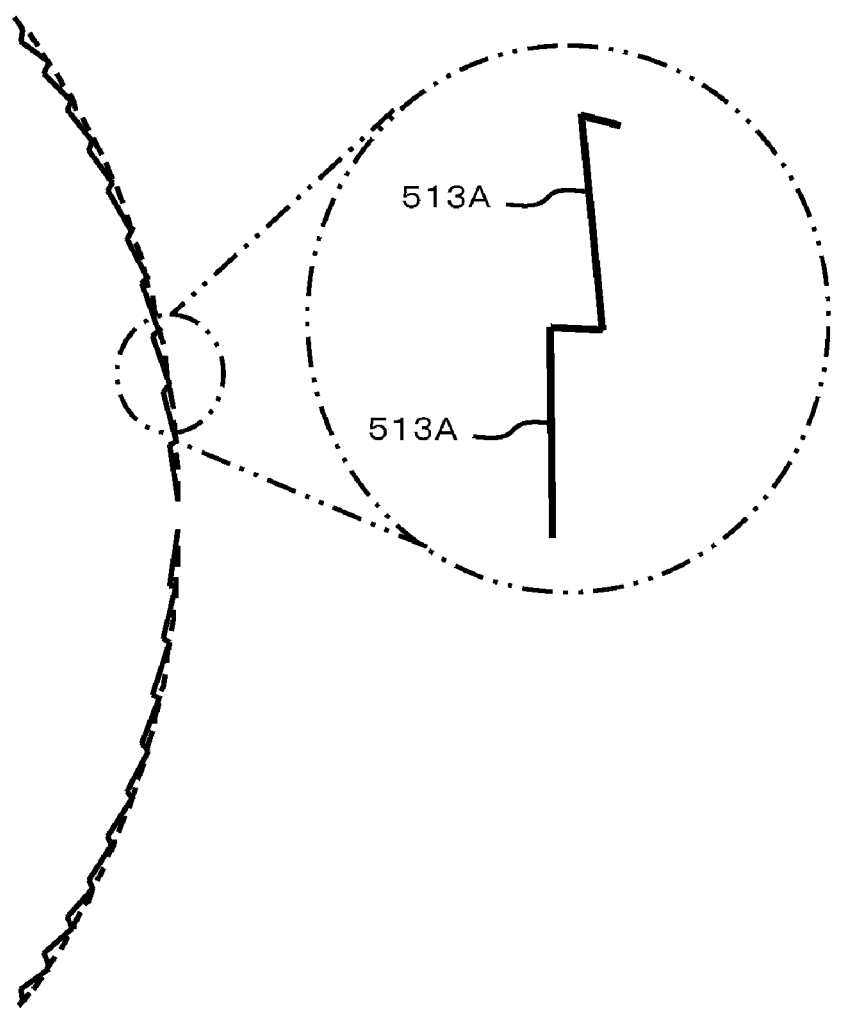
FIG. 12 is a sectional view showing a magnified view of the directions of blazed grooves on a mirror.
Figure 13:
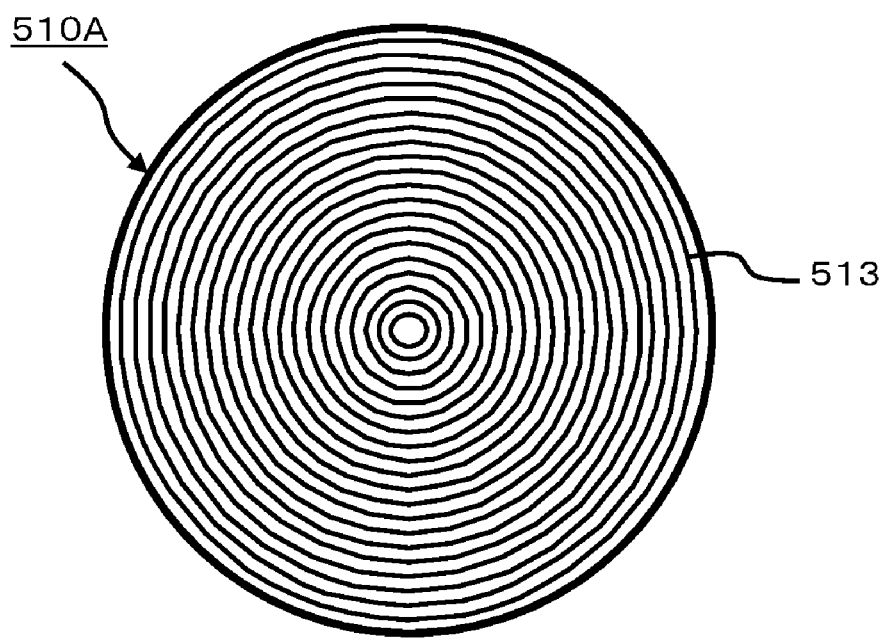
FIG. 13 is a plan view showing the blazed grooves on the mirror.

FIG. 12 is an explanatory figure showing the collimator mirror 510A in magnified view. The blazed grooves 513 in this second embodiment are different from the blazed grooves of the first embodiment shown in FIG. 6, in that, as shown in FIG. 12, they are formed so that their abrupt step portions face away from the center of the mirror towards its outer edge. To express this in another manner, each of the blazed grooves 513 is formed so that its sloping portion inclines relatively gently from the outside of the mirror towards the center of the mirror. Moreover, as shown in the plan view of FIG. 13, the blazed grooves 513 of this second embodiment are formed as concentric circles.

Since the operation of the collimator mirror 510A is the same as in the case of the first embodiment, it will be explained with reference to FIG. 4. In this embodiment, a total of 850 of the Mo/Si pair layers are laid over one another upon the substrate portion 511. If the thickness of one of these pair layers is taken as being 6.9 nm, then the dimension H0 is 5.865 µm. And, in this embodiment, the blazed grooves 513 are formed at a pitch of 400 µm through the upper 800 pair layers (so that, in this case, their thickness is 5.520 µm). As a result, the angle θB becomes 13.8 mrad, so that 2θB is 27.6 mrad.

If the angle of incidence of the radiation 203 which is incident upon this collimator mirror 510A is termed α, then the EUV radiation 204 is reflected at the angle α towards the fly-eye mirror array 520, while the DUV, UV, VIS, and IR radiation 302A such as the laser radiation etc. is regularly reflected at the angle α+2θB.

The IR radiation such as the $CO_2$ laser radiation and so on is diffracted (302B) at an angle of α+θD (or α−θD) by the blazed grooves (which have pitch of 400 µm). In this embodiment θd is 27.6 mrad, because the wavelength of the $CO_2$ laser is set to be 10.6 µm.

Although for convenience this feature is not shown in the figures, the DUV, UV, and VIS radiation are diffracted by the gratings which are formed by the periodic stripes of silicon and molybdenum appearing on the front surfaces of the blazed grooves 513 (which in this embodiment are at a pitch of 0.5 µm), and proceed onward at angles which are different from that of the EUV radiation 204. Accordingly, with this second embodiment having the above structure, it is possible to obtain similar beneficial effects to those obtained in the case of the first embodiment. In this connection, in the same way as with the first embodiment, it would also be acceptable to strengthen the advantageous effect of action as a SPF by adding, to the configuration of this second embodiment, a pinhole array 530 which is positioned at the location of the focus point group which is formed by the fly-eye mirror array 520, thus intercepting the radiation 302 other than the EUV radiation with the wall portion of the pinhole array 530.

Embodiment 3

Figure 14:
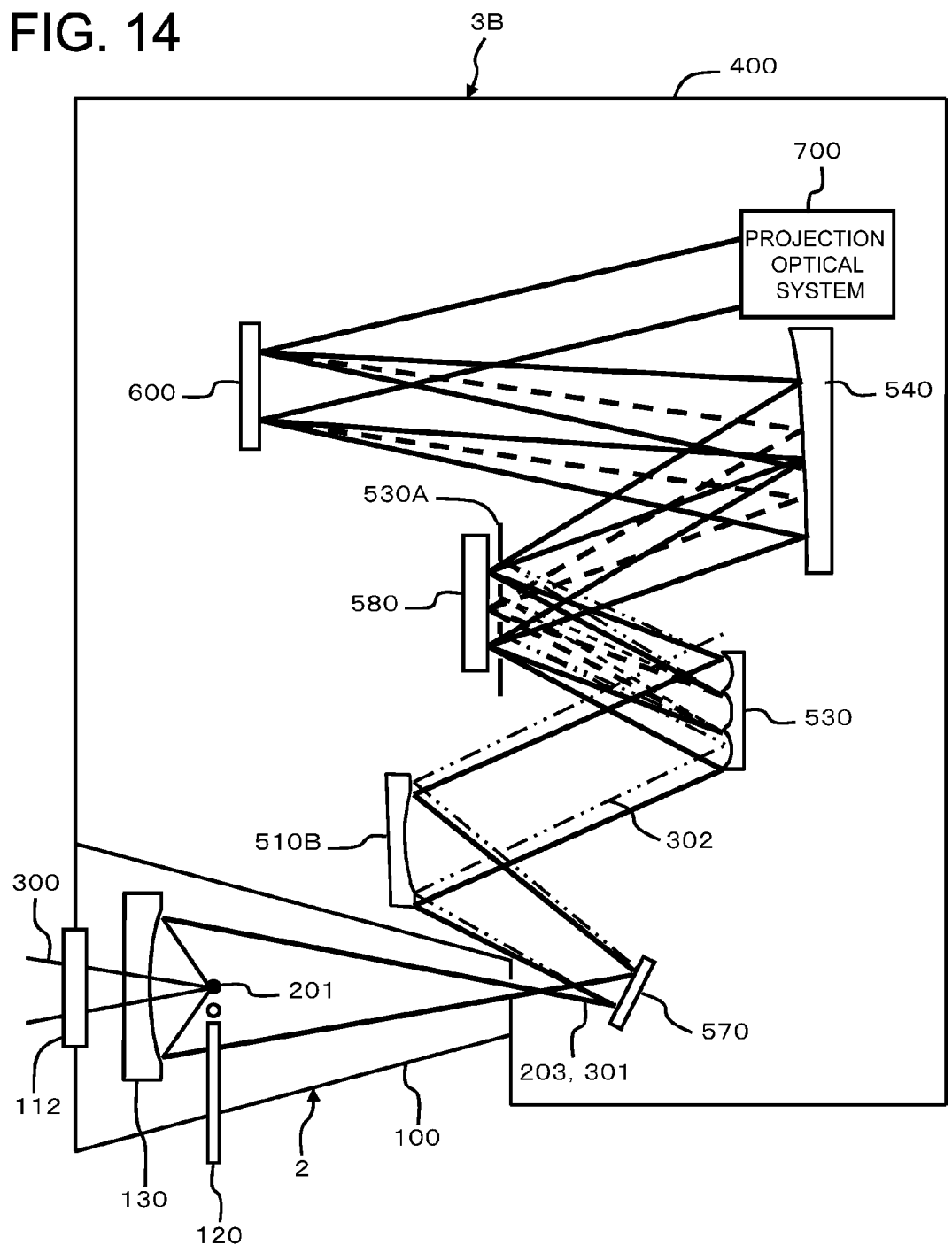
FIG. 14 is an explanatory figure showing an exposure device according to a third embodiment.

A third embodiment will now be explained on the basis of FIG. 14. FIG. 14 is an explanatory figure showing the structure of an exposure device 3B according to this embodiment. In this embodiment, blazed grooves are formed upon an inlet mirror 570 upon which the radiation from the EUV light source device 2 is initially incident. The collimator mirror 510B of this embodiment is different from the collimator mirrors 510 and 510A of the embodiments described above, in that no blazed grooves are provided thereupon. In other words, the collector mirror 510B of this embodiment is a mirror which simply reflects radiation which is incident onto it into parallel radiation, but is not endowed with the function of operating as an SPF.

A plurality of parallel blazed grooves are formed upon the inlet mirror 570, just as was the case with the collimator mirror 510 described with reference to the first embodiment.

In other words, the inlet mirror 570 is made by laminating 300 pair layers of Mo/Si upon a flat plate substrate, and by leaving the lowermost 50 of these pair layers just as they are, while forming blazed grooves in the uppermost 250 pair layers.

Furthermore, in this embodiment, a second fly-eye mirror array 580 is provided upon the optical path between the fly-eye mirror array 530 and the condenser mirror 540. A pinhole array 530A is arranged so as to be positioned quite close to this second fly-eye mirror array 580. In this embodiment, by providing the plurality of fly-eye mirror arrays 530 and 580, it is possible to make the intensity of the EUV radiation which is incident upon the mask 600 uniform in an even more effective manner.

The EUV radiation is reflected by the second fly-eye mirror array 580 and is incident upon the condenser mirror 540. By contrast, the radiation 302 other than the EUV radiation, after having been reflected by the first fly-eye mirror array 530, is intercepted by the pinhole array 530A which gets in its way, and is converted into heat.

With this embodiment having the structure described above, similar beneficial effects are obtained as in the case of the other embodiments described above. However, with this embodiment, since the inlet mirror 570 which is newly added is the one which is endowed with the function of acting as an SPF, accordingly the number of reflections is increased by one. Thus, the amount of EUV radiation which is incident upon the mask 600 is somewhat decreased, as compared with the other embodiments described above. However, since this inlet mirror 570 of this embodiment is made as a planar mirror, accordingly it is simpler and easier to manufacture as compared with the collector mirrors of the first and second embodiments described above, and it is possible to reduce its manufacturing cost.

Embodiment 4

Figure 15:
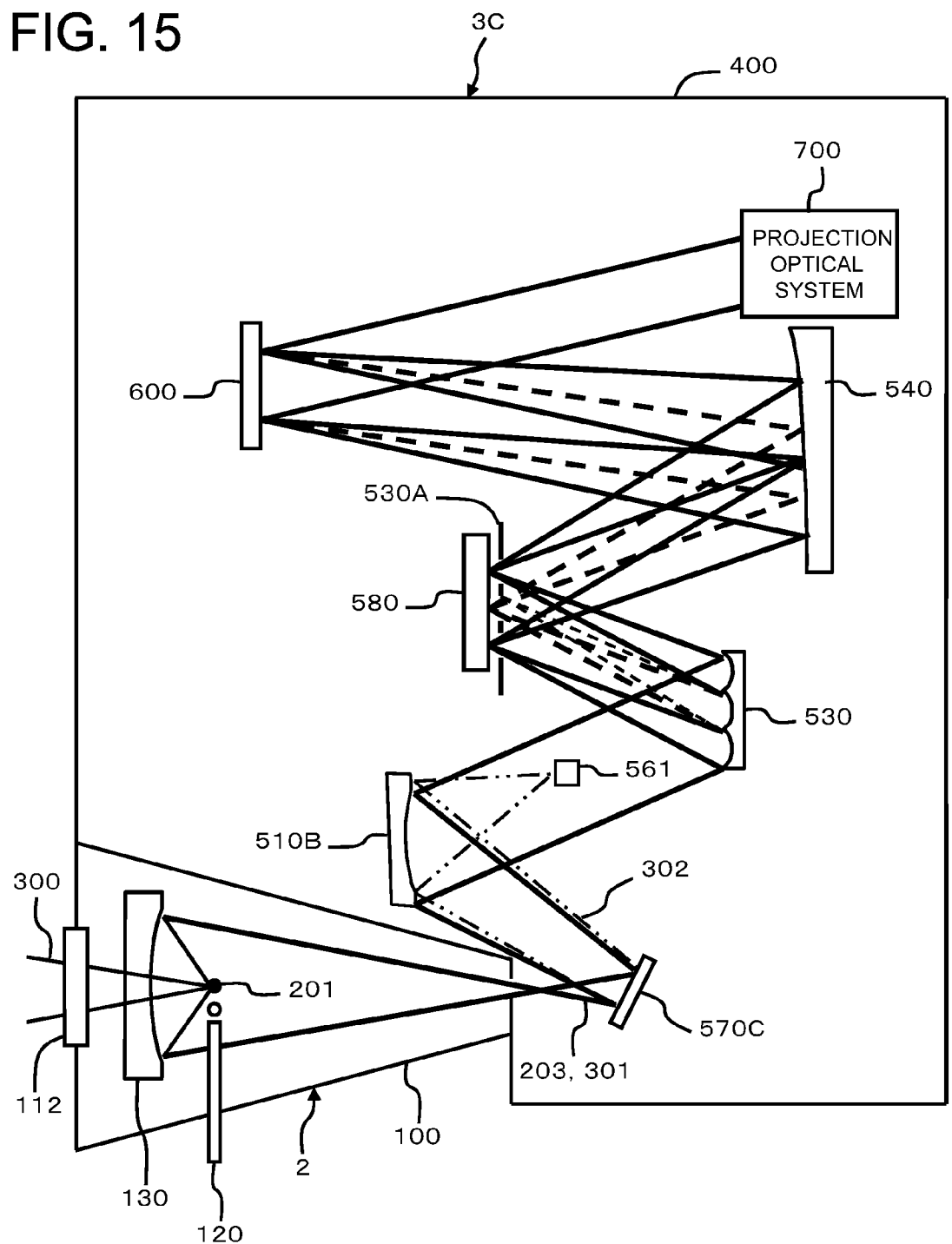
FIG. 15 is an explanatory figure showing an exposure device according to a fourth embodiment.

A fourth embodiment will now be explained on the basis of FIG. 15. The exposure device 3C of this fourth embodiment is provided with an inlet mirror 570C which is made as a planar mirror, in a similar manner to the third embodiment described above. However, on this inlet mirror 570C, the direction of the blazed grooves is changed to be similar to that in the second embodiment. On this inlet mirror 570C, the blazed grooves are formed as concentric circles, as shown in FIG. 13. Moreover, in this exposure device 3C, a dumper 561 is provided between the collimator mirror 510B and the fly-eye mirror array 530.

In this embodiment, due to the provision of the planar mirror 570C, the direction of progression of the EUV radiation and the direction of progression of the radiation of other wavelengths are different, and the radiation 302 of other wavelengths is absorbed by the dumper 561. Thus, with this fourth embodiment having the structure described above, similar beneficial operational effects are obtained, as with the third embodiment described above.

Embodiment 5

Figure 16:
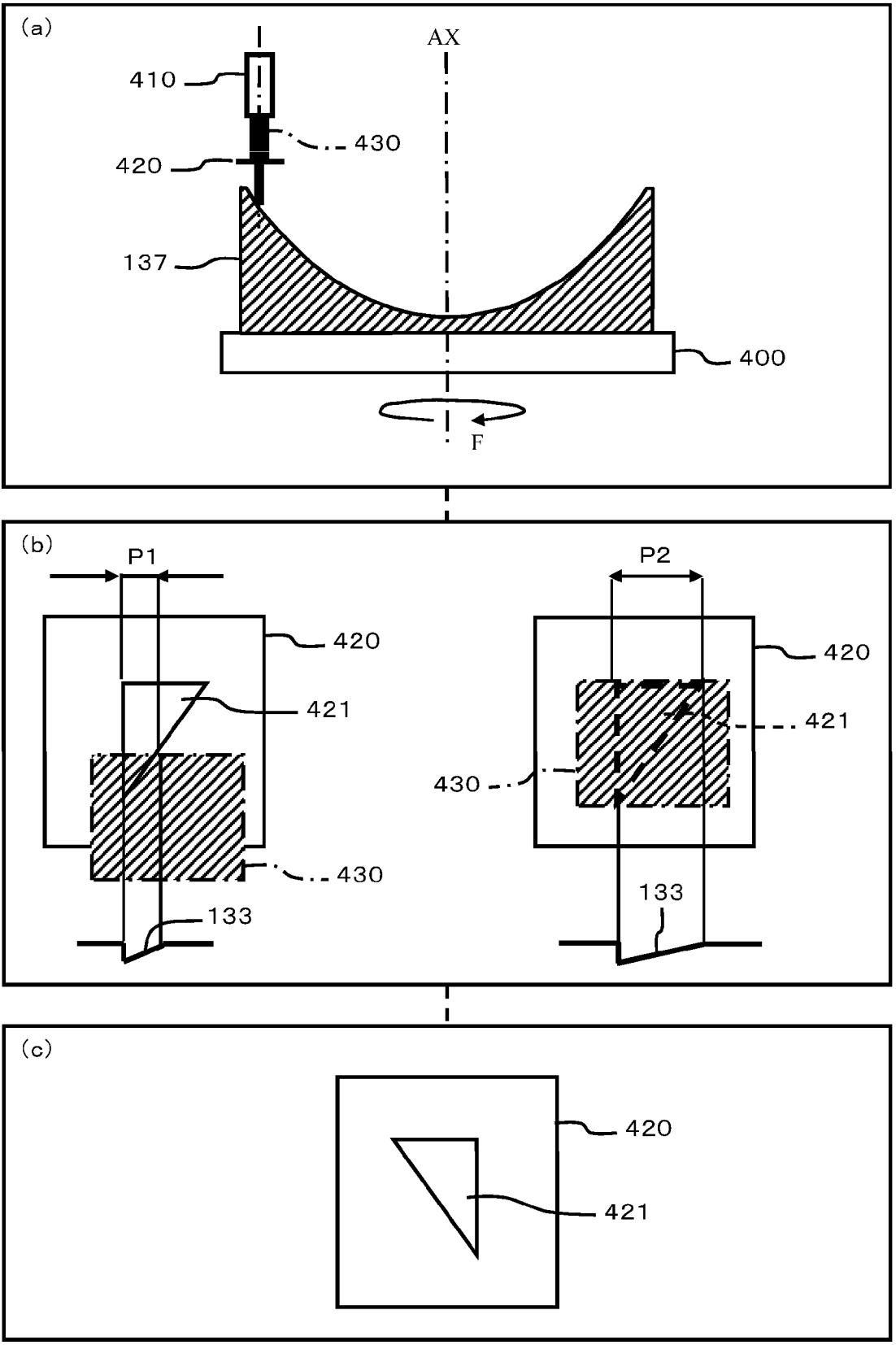
FIG. 16 is an explanatory figure showing a method of manufacturing a mirror according to a fifth embodiment.

A fifth embodiment will now be explained on the basis of FIG. 16. This involves a method of manufacturing the mirror 510A of the second embodiment, which is endowed with the function of acting as an SPF.

As shown in FIG. 16(a), a mirror member 137 which is made by coating a predetermined number of composite pair layers upon a substrate portion is loaded upon a rotational stage 400 and is rotated. And a cutting process for forming blazed grooves is performed by irradiating an ion beam 430 upon these composite pair layers, using an ion milling device 410 and a mask 420.

And, as shown in FIG. 16(b), a pattern 421 shaped as a right angled triangle, and through which the ion beam 430 passes, is formed in the mask 420. Accordingly, the width P of the blazed grooves (see FIG. 4) can be adjusted by changing the relative positional relationship between the pattern 421 and the ion beam 430, so as to be, for example, like P1 or P2 shown in FIG. 16(b).

As shown on the left side of FIG. 16(b), when the area of overlap between the triangular shaped pattern 421 and the ion beam 430 is small, it is possible to form narrow blazed grooves of width P1 as shown at the lower portion of this figure. On the other hand, as shown on the right side of FIG. 16(b), when the ion beam 430 is overlapped over the entire surface of the triangular shaped pattern 421, it is possible to form broad blazed grooves of width P2.

Each time the formation of one blazed groove has been completed, the ion milling device 410 and the mask 420 are shifted in the radial direction (the horizontal direction in FIG. 16) by just the desired pitch for the grooves, and then the ion beam is again irradiated and a new blazed groove is formed.

If blazed grooves like those shown in FIG. 4 are to be formed, then, as shown in FIG. 16(c), a mask 420 is used in which the orientation of the triangular shaped pattern 421 is changed. Thus, with this embodiment of the present invention having the structure described above, it is possible to manufacture the collimation mirror 510A described above according to the second embodiment, in a simple and easy manner.

In the case of the collimator mirror 510 described in connection with the first embodiment, the mirror member 137 with the multi layer attached is not loaded upon a rotational stage 400 and rotated in the F direction as in described in connection with this embodiment; rather, it can be made by the following method. It is possible to manufacture the collimator mirror 510 of the first embodiment by loading the mirror member 137 upon a two-axis type orthogonal stage which is shiftable in the horizontal direction and shifting it linearly, so as to process rectilinear grooves into it. Moreover, the mirrors 570 and 570C described in connection with the third and the fourth embodiments can be made by substantially the same manufacturing method as that described above, the only difference being the feature that the mirror member 137 is planar.

Embodiment 6

Figure 17:
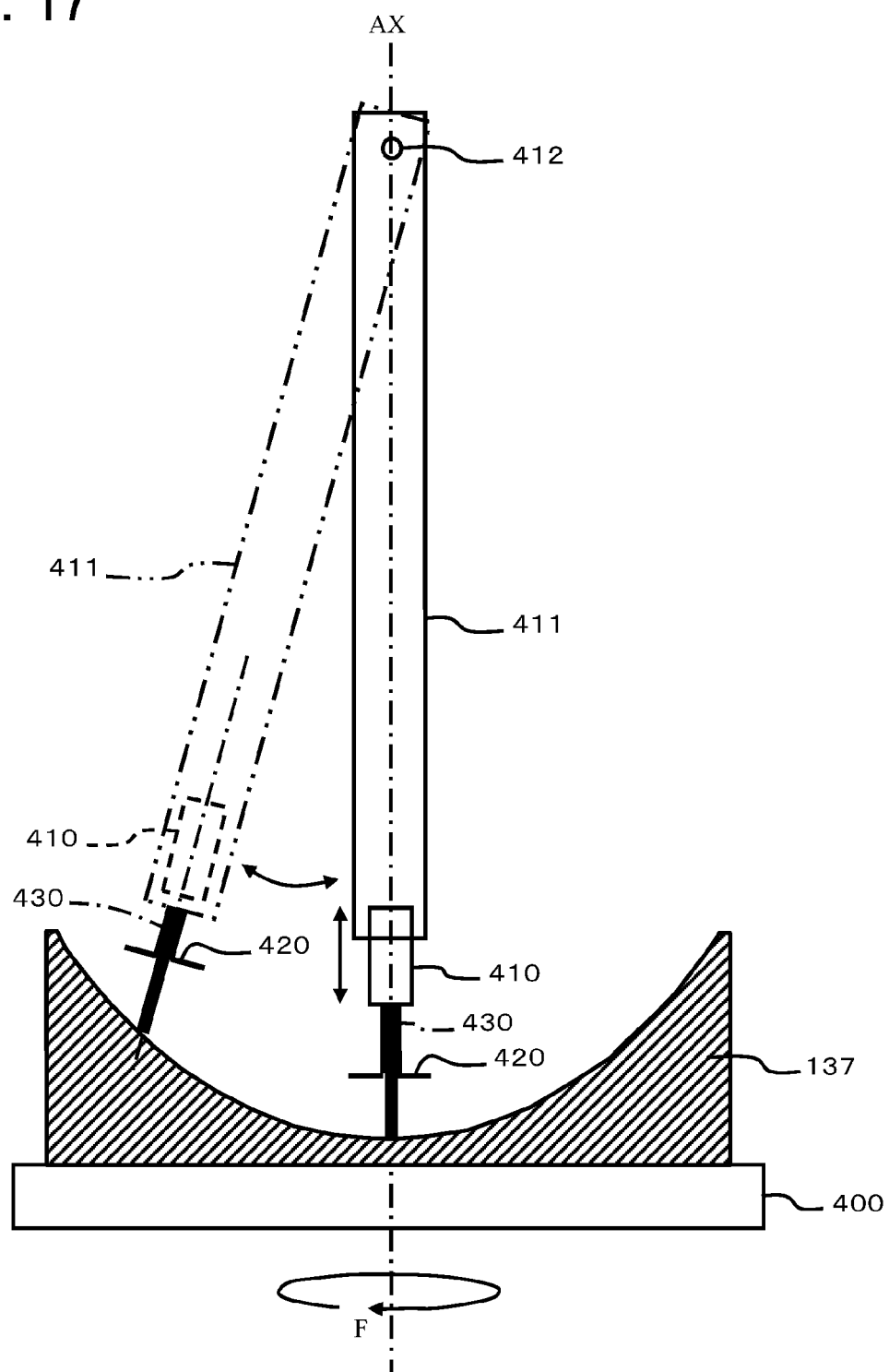
FIG. 17 is an explanatory figure showing a method of manufacturing a mirror according to a sixth embodiment.

A sixth embodiment will now be explained on the basis of FIG. 17. This sixth embodiment is one which is effective if the mirrored surface of the mirror member 137 with the multi layer attached thereon is a curved surface. For example, when manufacturing the collimator mirror 510A of the second embodiment which has a curved surface, the ion milling device 410 and the mask 420 are swung around a rotational axis 412 which is positioned to correspond to the focus point at which the radiation 302 other than the EUV radiation is to be gathered together.

The ion milling device 410 and the mask 420 are fitted to a long tubular support device 411 so as to be shiftable along its axial direction. This support device 411 is rotatable in the left and right directions in FIG. 17 about the rotational axis 412 as a center. The rotational axis 412 is set to a distance which is separated from the center of the mirror surface of the mirror member 137 (i.e. from where the center of the mirror surface will be when it is completed) by just the distance desired for the focus point IF. Then the blazed grooves are formed while swinging the ion milling device 410 and the mask 420 axially in the sideways direction in the figure.

The rotational axis 412 is set to the same position with respect to the collimation mirror 510A as the position at which the focus point for condensation of the radiation reflected by the mirror 510A other than the EUV radiation will be located. Due to this, it is possible to keep the angle at which the ion beam is incident upon the multi layer constant, and thus it is possible to process the blazed grooves in a constant shape in a stable manner. This means that it is possible to prevent shadow areas occurring upon the collimation mirror 510A, in which the EUV radiation is hindered by the edges of the blazed grooves and cannot be properly incident.

In a similar manner, it would also be possible to make the rotational axis 412 and the center of curvature of the mirror surface which is being processed coincide with one another. Even if the rotational axis is made to agree with the center of curvature of the mirror which is being processed in this manner, this is effective for making it possible to keep the angle at which the ion beam is incident upon the multi layer constant, so that it is possible to process the blazed grooves in constant shapes in a stable manner. Moreover, the collimator mirror 510 described with reference to the first embodiment may be manufactured by loading the mirror member 137 with the multi layer attached thereto upon a two-axis orthogonal stage which can be shifted in the horizontal direction, and by thus processing the grooves into the shapes of straight lines, instead of by loading the mirror member 137 upon the rotational stage 400 and rotating it.

Embodiment 7

A seventh embodiment, in which the mirror 510A which is endowed with the function of acting as a SPF is manufactured by a different method, will now be explained on the basis of FIG. 18. In this seventh embodiment, as shown in FIG. 18(*a*), the position of the rotational axis 412 is set to a position which coincides with the center of curvature of the mirror surface. Moreover, as shown in FIG. 18(*b*), a mask 420A is used whose length corresponds to the radius of the collimator mirror 510A, and a pattern 421, consisting of a plurality of right angled triangles corresponding to each of the blazed grooves which are to be formed, is provided upon this long mask 420A. Accordingly, it is possible to form the blazed grooves by simply irradiating the ion beam while swinging the ion milling device 410 in the diametrical direction and while rotating the mirror 510A, without any necessity for shifting the mask 420A.

With this seventh embodiment of the present invention having the structure described above, it is again possible to prevent the occurrence of so called shadow portions such as described above, just as in the case of the sixth embodiment described above, and it is thus possible to provide a collimator mirror 510A which condenses and separates out the EUV radiation with good efficiency. Moreover, since the angle at which the ion beam is incident upon the multi layer is kept constant, and moreover since the distance between the mask 420A and the surface of the mirror is kept constant, accordingly it is possible to process the blazed grooves in more constant shapes, in a stabilized manner. Furthermore, it would also be possible to manufacture the collimator mirror 510 described with reference to the first embodiment by loading the mirror member 137 with the multi layer attached thereto upon a two-axis orthogonal stage which can be shifted in the horizontal direction, and by thus processing the grooves into the shape of straight lines, instead of by loading the mirror member 137 upon the rotational stage 400 and rotating it. Yet further, it would be possible to manufacture the mirror 570 and the mirror 570C described above with reference to the third and the fourth embodiment respectively, by substantially the same method as the manufacturing method described above, with the point of difference being that the mirror member 137 is a planar surface.

Embodiment 8

Figure 19:
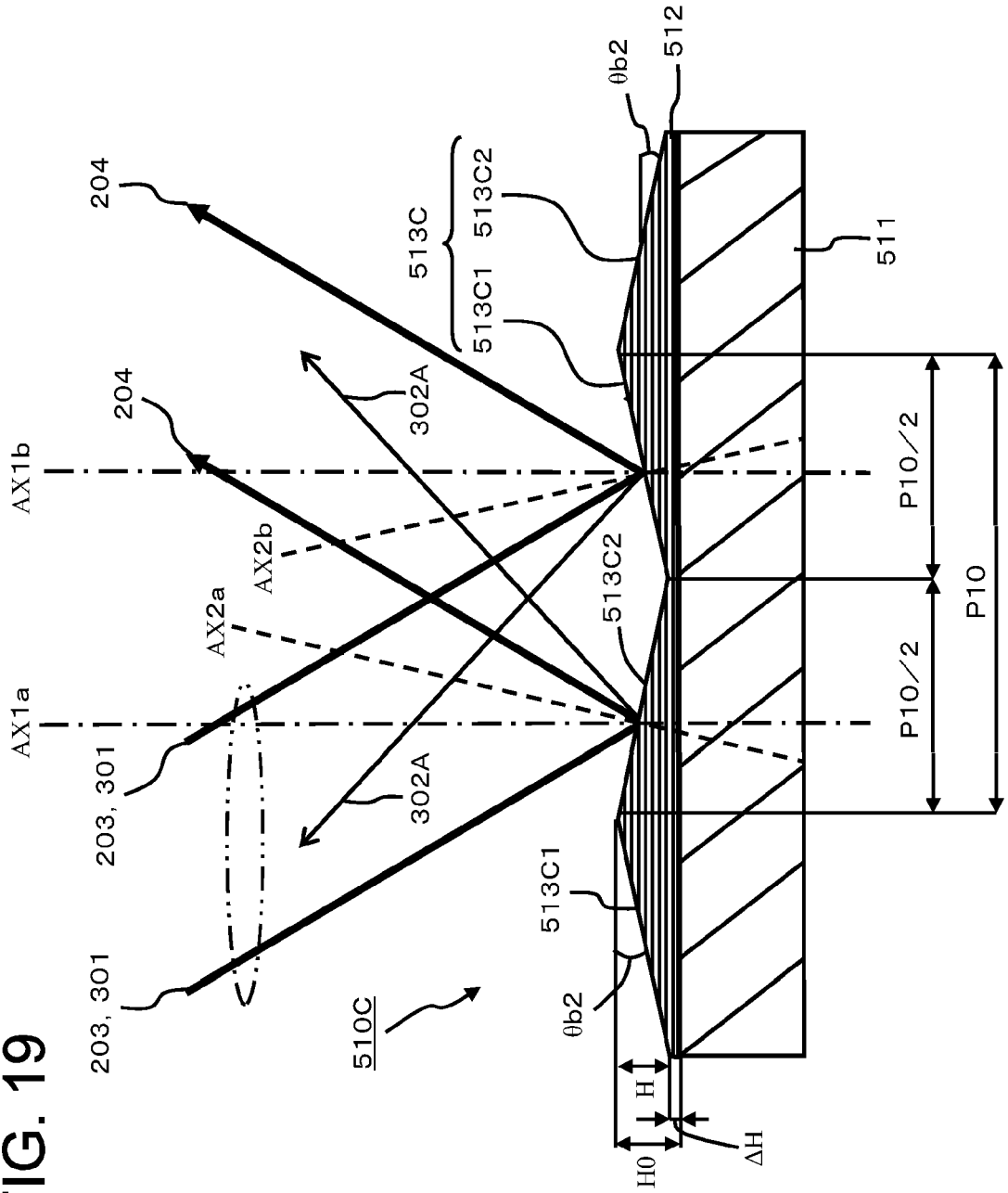
FIG. 19 is an explanatory figure showing a magnified view of a mirror according to an eighth embodiment.

An eighth embodiment of the present invention will now be explained on the basis of FIG. 19. On the mirror 510C of this eighth embodiment, instead of blazed grooves, triangular roof-like grooves 513C are provided. And, in this mirror 510C of this eighth embodiment, these triangular roof-like grooves 513C are, again, formed integrally in a multi layer which covers the front surface of the substrate portion 511. In a similar manner to the procedure for the first embodiment, in this embodiment as well, for example, 300 pair layers of Mo/Si are layered together into a multi layer on the substrate portion 511, and then the triangular roof-like grooves or triangular roof shapes are formed in the uppermost 250 of these 300 pair layers, from the front surface inwards. In FIG. 19, the axial lines AX1*a* and AX1*b* are perpendiculars to the substrate portion 511, while the other axial lines AX2*a* and AX2*b* are axes which are perpendicular to the sloping roof-shaped surfaces of the triangular roof-like grooves 513C.

Each of these triangular roof-like grooves 513C has two sloping surfaces 513C1 and 513C2. The tilt angles θb2 of these two sloping surfaces 513C1 and 513C2 may be set to be the same. Here, for convenience of explanation, the sloping surfaces on the left side in FIG. 19 will be termed the first sloping surfaces 513C1, while the sloping surfaces on the right side in FIG. 13 will be termed the second sloping surfaces 513C2.

The triangular roof-like grooves 513C, for example, may be formed at a pitch P10 of around 800 μm. In this case, the first sloping surfaces 513C1 and the second sloping surfaces 513C2 are defined alternatingly at intervals of 400 μm (which=P10/2) in the direction parallel to the substrate portion 511. To put this in another manner, with the collimator mirror 510C of this embodiment, the orientations of the sloping surfaces 513C1 and 513C2 change to and fro in opposite senses at this pitch P10/2.

According to the inclinations of the sloping surfaces 513C1 and 513C2, the radiation other than the EUV radiation (i.e. the driver laser radiation, and DUV, UV, VIS, and IR) is regularly reflected by these sloping surfaces, and is directed in directions which are different from that of the reflected EUV radiation 204. The EUV radiation is Bragg diffracted by the foundation portion 512 and by the 10 to 50 Mo/Si pair layers which are laid thereupon underneath the portion in which the triangular roof-like grooves 513C are formed. The efficiency of this diffraction is the same as that of a mirror upon which Mo/Si pair layers are provided.

Furthermore, due to the triangular roof-like grating structure having a period of 800 μm which is defined, the VIS and IR radiation described above are diffracted in directions which are different from that of the EUV radiation. Moreover, due to the gratings which are defined by the periodic stripe patterns of the Mo/Si pair layers which are exposed upon the sloping surfaces 513C1 and 513C2, the radiation of comparatively short wavelengths other than the EUV radiation and the IR radiation (i.e. the DUV, UV, and VIS) is diffracted in directions which are different from that of the reflected EUV radiation 204.

It would also be acceptable to arrange to set the value of the pitch P10 to some other value such as 400 μm or the like, instead of to 800 μm. Furthermore, it is not necessary to keep the pitch constant; it would also be acceptable to change the pitch according to the position in which the triangular roof-like grooves 513C are formed. Moreover, it would also be possible to set the pitch of the sloping surfaces 513C1 and the pitch of the sloping surfaces 513C2 to be different: for example, the pitch of the sloping surfaces 513C1 might be set to 300 μm and the pitch of the sloping surfaces 513C2 might be set to 500 μm. By installing a mirror of the structure described in this embodiment to the illumination optical system 500, it is possible to obtain similar beneficial operational effects, as in the cases of the first through the fourth embodiments described above.

Embodiment 9

Figure 20:
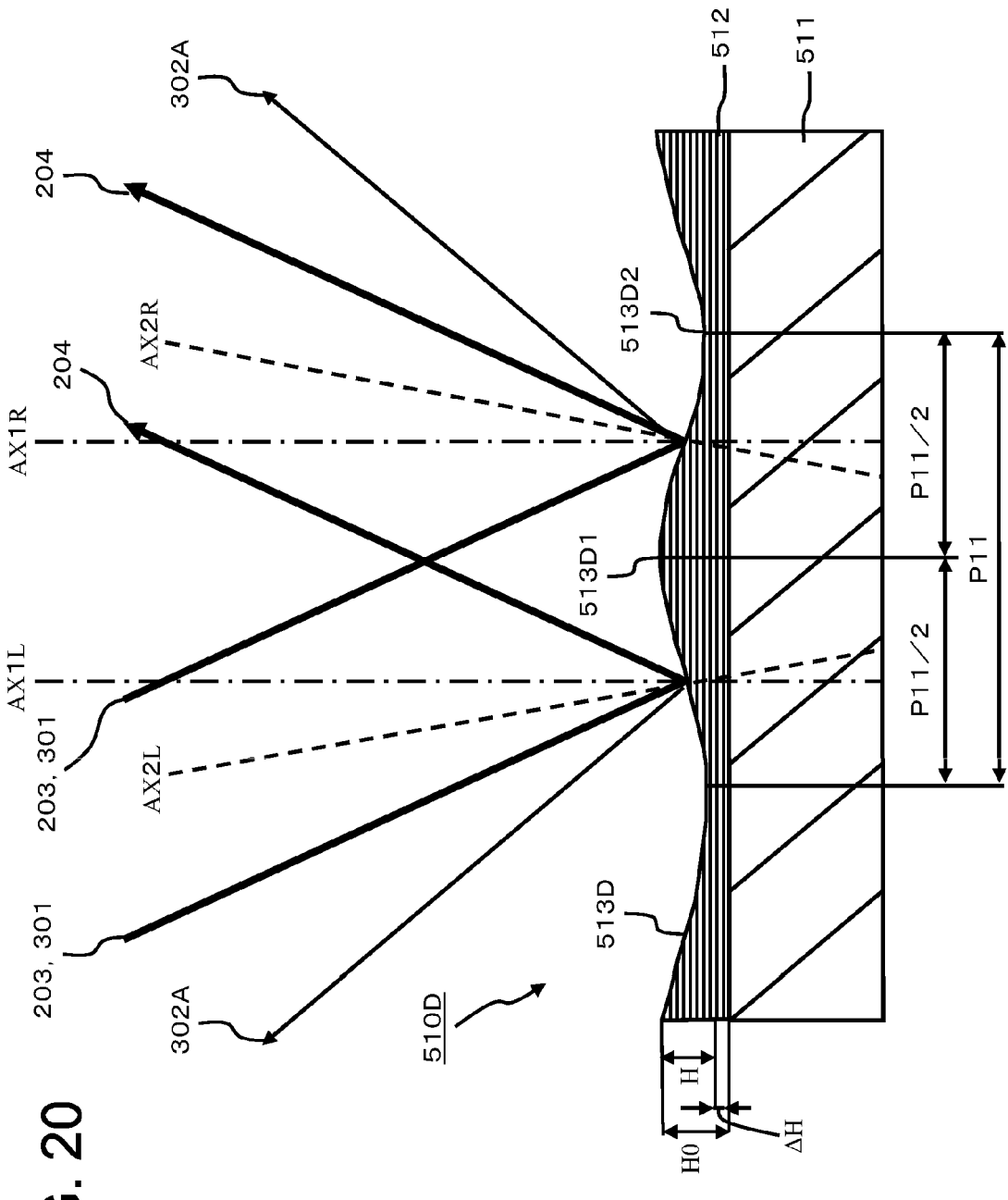
FIG. 20 is a sectional view showing a magnified view of a mirror according to a ninth embodiment.

A ninth embodiment will now be explained on the basis of FIG. 20. The mirror 510D of this ninth embodiment is formed with relatively smooth undulating wave-like grooves 513D. The wave-like shape of these grooves 513D may, for example, be, at least approximately, a sinusoidal shape. In this embodiment as well, for example, 300 Mo/Si pair layers are laminated upon the foundation 511 as a multi layer, and then the wave-like grooves 513D are formed in the uppermost 250 of these pair layers, from the front surface. In FIG. 20, the axial lines AX1L and AX1R are lines which are perpendicular to the substrate portion 511, while the other axial lines AX2L and AX2R are lines which are perpendicular to the arcuate surfaces at their steepest points. The reference symbol 513D1 denotes a summit of one of the wave-like shapes, while the reference symbol 513D2 denotes a valley thereof.

With the mirror 510D according to this embodiment, the inclination of the surface changes relatively smoothly in a sinusoidal fashion repeatedly at the pitch P10 (which may be, for example, 600 μm). According to the inclinations of the arcuate surfaces, the radiation other than the EUV radiation (i.e. the driver laser radiation, and the DUV, UV, VIS, and IR) is reflected in a direction which is different from that of the reflected EUV radiation 204.

However at places when these inclinations are nearly horizontal, as at the summit 513D1, and close to these places, the EUV radiation and the radiation other than the EUV radiation (i.e. the driver laser radiation, and the DUV, UV, VIS, and IR) are all regularly reflected in approximately the same direction.

As described above, the EUV radiation is Bragg diffracted by the foundation portion 511 and by the 10 to 50 Mo/Si pair layers which lie underneath the portion in which the wave-like grooves 513D are formed. The efficiency of this diffraction is the same as that of a mirror upon which Mo/Si pair layers are provided. Furthermore, due to the wave-like grating structure having, for example, a period of 600 μm, the radiation other than the EUV radiation is diffracted in directions which are different from that of the EUV radiation. Moreover, due to the grating which is defined by the periodic stripe pattern of the Mo/Si pair layers which are exposed upon the arcuate surfaces, the radiation of comparatively short wavelengths other than the EUV radiation and the IR radiation (i.e. the DUV, UV, and VIS) is diffracted in directions which are different from that of the reflected EUV radiation 204.

By installing a mirror of the structure described in this embodiment to the illumination optical system 500, it is possible to obtain similar beneficial operational effects, as in the cases of the first through the fourth embodiments described above.

Embodiment 10

Figure 21:
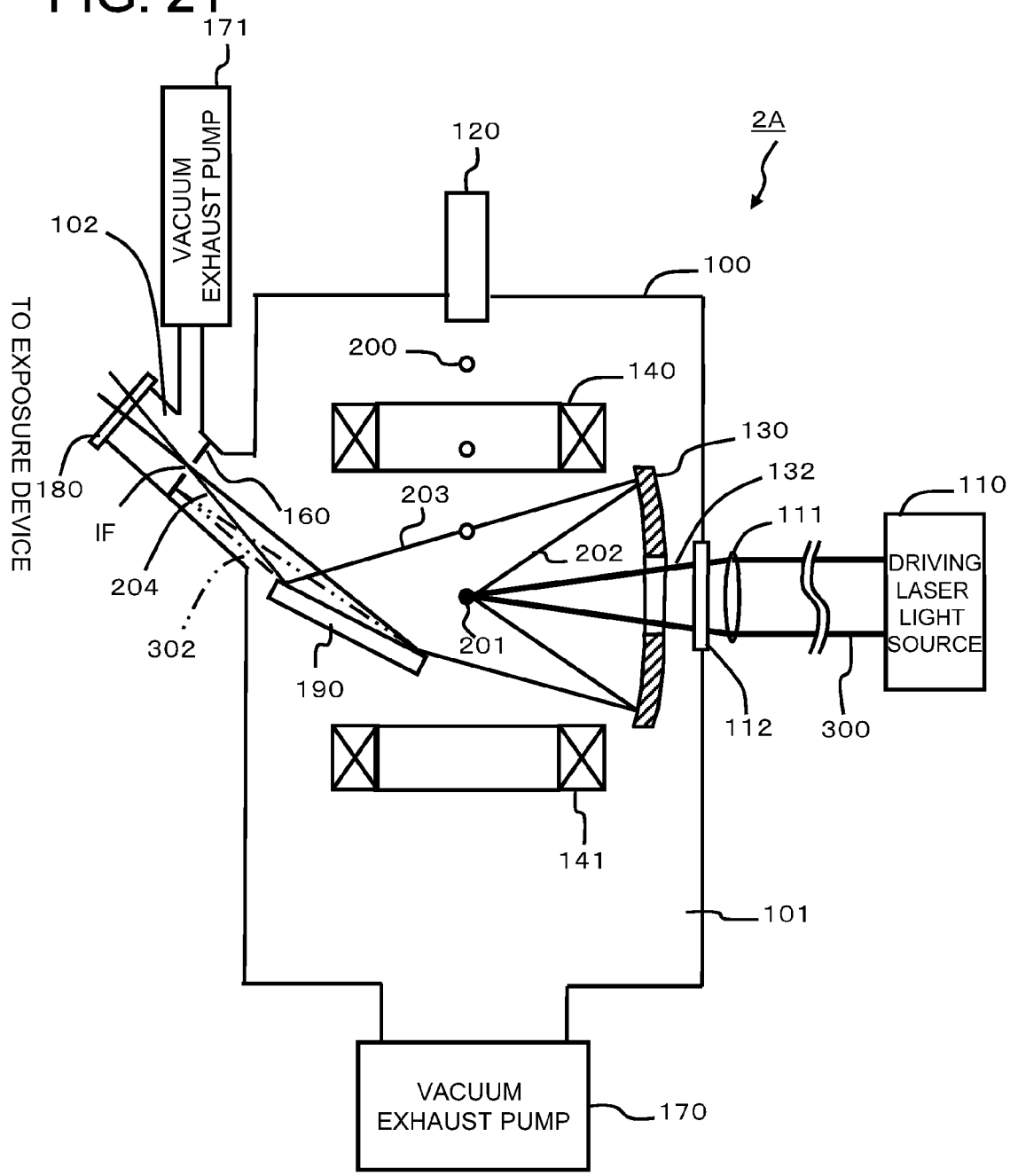
FIG. 21 is an explanatory figure showing an exposure device incorporating a mirror according to a tenth embodiment.

A tenth embodiment will now be explained on the basis of FIG. 21. In this tenth embodiment, a plane mirror 190 having a structure like that described with reference to FIG. 4 is provided within the EUV light source device 2A. The EUV radiation which is reflected by this plane mirror 190 passes through an aperture member 160, and is supplied to the exposure device. The radiation 302 other than EUV radiation is reflected by the plane mirror 190 and is incident upon the aperture member 160, and is absorbed by the aperture member and is converted to heat. It is desirable for the angle of incidence of the EUV radiation 203 upon the plane mirror 190 to be kept less than or equal to around 30°, as shown using FIG. 8.

Embodiment 11

Figure 22:
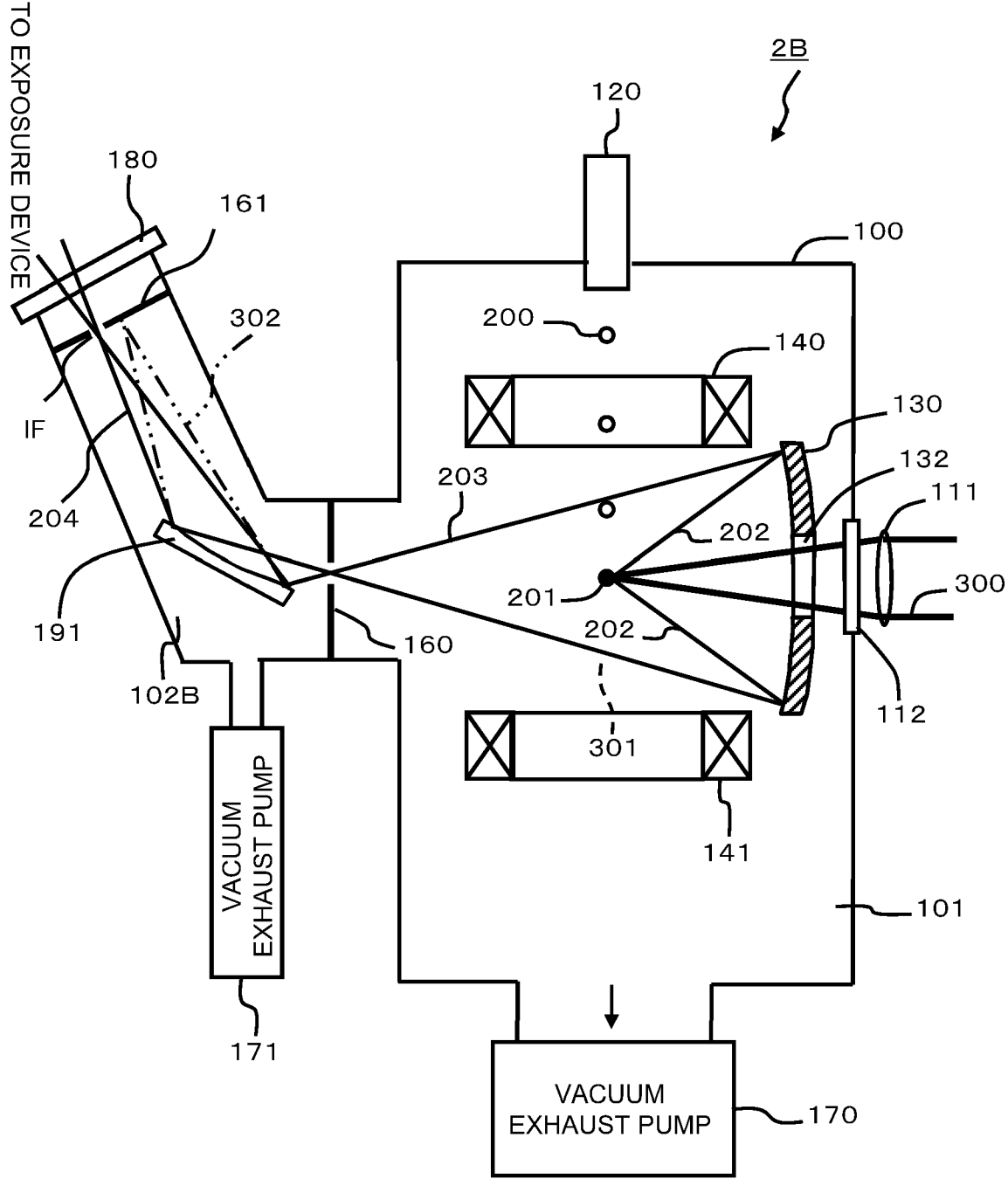
FIG. 22 is an explanatory figure showing an exposure device incorporating a mirror according to a eleventh embodiment.

An eleventh embodiment will now be explained on the basis of FIG. 22. In this eleventh embodiment, a concave surface mirror 191 having a structure like that described with reference to FIG. 4 is provided within the second chamber 102B of the EUV light source device 2B. The EUV radiation 203 which is incident through the aperture member 160 into the second chamber 102B is reflected by this concave surface mirror 191 (204), and passes through an another aperture member 161 and is supplied to the exposure device. The radiation other than EUV radiation is reflected (302) by the concave surface mirror 191 and is incident upon the aperture member 161 and is absorbed thereby. It is desirable for the angle of incidence of the EUV radiation 203 upon the concave surface mirror 191 to be kept less than or equal to around 30°, as shown using FIG. 8.

It should be understood that the present invention is not limited to the embodiments described above. On the basis of the disclosure herein, a person of ordinary skill in the art would be able to make various additions and/or changes and so on to the details of any particular embodiment, within the scope of the present invention. For example, it would also be acceptable to provide a structure in which mirrors upon which multiple Mo/Si pair layers formed with grooves of predetermined shapes were provided both to the exposure device and also to the EUV light source device.

The invention claimed is:

1. A semiconductor exposure device comprising:
an illumination optical system for directing EUV (extreme ultraviolet) light from an EUV light source to a mask; and
mirrors included in the illumination optical system, one of the mirrors comprising a multilayered reflecting coating with grooves and being configured for reflecting the EUV light from the EUV light source to direct the EUV light to the mask, the grooves being arranged in a concentric fashion, wherein
the EUV light source is configured for irradiating a target with laser light from a driver laser to turn the target into plasma from which the EUV light is emitted, and
the grooves are configured for diffracting at least light at a wavelength which is the same as that of the laser light from the drive laser.

2. The semiconductor exposure device according to claim 1, wherein the one of the mirrors is a collimator mirror.

3. The semiconductor exposure device according to claim 2, wherein the grooves are arranged concentrically with respect to a center of the collimator mirror.

4. The semiconductor exposure device according to claim 1, wherein the one of the mirrors is placed to first receive the EUV light from the EUV light source.

5. The semiconductor exposure device according to claim 1, wherein the wavelength of the light to be diffracted by the grooves is approximately 10.6 μm.

6. The semiconductor exposure device according to claim 1, wherein the driver laser is a carbon dioxide ($CO_2$) laser.

7. The semiconductor exposure device according to claim 1, wherein a distance between a nadir of one groove and that of an adjacent groove is in a range of 1.54 μm to 400 μm.

8. The semiconductor exposure device according to claim 1, wherein a distance between a nadir of one groove and that of an adjacent groove is in a range of 400 μm to 800 μm.

9. The semiconductor exposure device according to claim 1, wherein a distance between a nadir of one groove and that of an adjacent groove is in a range of 1.54 μm to 800 μm.

10. The semiconductor exposure device according to claim 1, further comprising a dumper for light to be diffracted by the grooves.

11. The semiconductor exposure device according to claim 10, further comprising a cooling device for cooling the dumper.

12. The semiconductor exposure device according to claim 10, wherein the wavelength of the light to be diffracted by the grooves is approximately 10.6 μm.

13. The semiconductor exposure device according to claim 10, wherein the light to be diffracted by the grooves is laser light from a carbon dioxide ($CO_2$) laser for generating the EUV light.

14. The semiconductor exposure device according to claim 1, wherein the multilayered reflecting coating comprises 100 to 1000 pairs of stacked Mo/Si layers.

15. The semiconductor exposure device according to claim 1,
wherein
the multilayered reflecting coating comprises pairs of stacked Mo/Si layers, and
a nadir of each groove reaches approximately 250th to 300th pair of the stacked Mo/Si layers from a surface of the one of the mirrors.

16. The semiconductor exposure device according to claim 1,
wherein
the one of the mirrors comprises a substrate having the multilayered reflecting coating thereon,
the multilayered reflecting coating comprises pairs of stacked Mo/Si layers, and
the multilayered reflecting coating includes approximately 50 pairs of the stacked Mo/Si layers between the nadir and the substrate.

17. The semiconductor exposure device according to claim 1, further comprising a surface coating on a surface of the multilayered reflecting coating.

18. The semiconductor exposure device according to claim 17, wherein a material of the surface coating includes ruthenium.

* * * * *